US012736790B2

(12) United States Patent
Budd et al.

(10) Patent No.: US 12,736,790 B2
(45) Date of Patent: Sep. 15, 2026

(54) OPTICAL APPARATUS FOR LASER ANNEALING

(71) Applicant: International Business Machines Corporation, Armonk, NY (US)

(72) Inventors: Russell A. Budd, North Salem, NY (US); Jason S. Orcutt, Katonah, NY (US); Eric Zhang, Sleepy Hollow, NY (US); Yves Martin, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 18/236,382

(22) Filed: Aug. 21, 2023

(65) Prior Publication Data

US 2025/0067967 A1 Feb. 27, 2025

(51) Int. Cl.

| | |
|---|---|
| ***G02B 21/00*** | (2006.01) |
| ***B23K 26/03*** | (2006.01) |
| ***B23K 26/064*** | (2014.01) |
| ***B23K 26/067*** | (2006.01) |
| ***B23K 26/351*** | (2014.01) |
| ***B23K 26/70*** | (2014.01) |

(Continued)

(52) U.S. Cl.

CPC .......... *G02B 21/006* (2013.01); *B23K 26/032* (2013.01); *B23K 26/0643* (2013.01); *B23K 26/0648* (2013.01); *B23K 26/067* (2013.01); *B23K 26/351* (2015.10); *B23K 26/705* (2015.10); *G02B 21/082* (2013.01); *H10N 60/0884* (2023.02); *H10N 60/0912* (2023.02)

(58) Field of Classification Search

CPC ................ G02B 21/006; G02B 21/082; B23K 26/032; B23K 26/0643; B23K 26/0648; B23K 26/067; B23K 26/351; B23K 26/705; H10N 60/0884; H10N 60/0912

See application file for complete search history.

(56) References Cited

U.S. PATENT DOCUMENTS

| | | | |
|---|---|---|---|
| 10,170,681 | B1 | 1/2019 | Rosenblatt et al. |
| 10,340,438 | B2 | 7/2019 | Rosenblatt et al. |
| 10,355,193 | B2 | 7/2019 | Rosenblatt et al. |

(Continued)

FOREIGN PATENT DOCUMENTS

| | | | |
|---|---|---|---|
| AU | 2021295256 | A1 | 11/2022 |
| AU | 2021404394 | A1 | 5/2023 |

(Continued)

OTHER PUBLICATIONS

E. J. Zhang et al., "High-performance Superconducting Quantum Processors via Laser Annealing of Transmon Qubits," Science Advances, May 13, 2022, 7 pages, vol. 8, No. 19.

(Continued)

*Primary Examiner* — Phu Vu

(74) *Attorney, Agent, or Firm* — Samuel Waldbaum; Ryan, Mason & Lewis, LLP

(57) ABSTRACT

An optical microscope device comprises an optically integrated configuration of components for imaging a target device within a field of view of the optical microscope device, and for laser annealing the target device by generating a laser beam spot pattern from a laser beam received on an optical fiber from a remote laser source, and for controlling a duration of exposure of the laser beam spot pattern for laser annealing the target device.

20 Claims, 15 Drawing Sheets

(51) Int. Cl.
*G02B 21/08* (2006.01)
*H10N 60/01* (2023.01)

(56) References Cited

U.S. PATENT DOCUMENTS

| | | | |
|---|---|---|---|
| 10,418,540 | B2 | 9/2019 | Orcutt et al. |
| 10,423,888 | B1 | 9/2019 | Hertzberg et al. |
| 10,424,713 | B2 | 9/2019 | Rosenblatt et al. |
| 10,475,983 | B1 | 11/2019 | Rosenblatt et al. |
| 10,510,943 | B1 | 12/2019 | Topaloglu et al. |
| 10,644,217 | B2 | 5/2020 | Rosenblatt et al. |
| 10,692,831 | B1 | 6/2020 | Bronn et al. |
| 10,707,402 | B2 | 7/2020 | Rosenblatt et al. |
| 10,833,242 | B2 | 11/2020 | Orcutt et al. |
| 10,886,454 | B2 | 1/2021 | Rosenblatt et al. |
| 10,903,412 | B2 | 1/2021 | Shao et al. |
| 11,010,685 | B2 | 5/2021 | Hertzberg et al. |
| 11,050,009 | B2 | 6/2021 | Topaloglu et al. |
| 11,195,982 | B2 | 12/2021 | Shao et al. |
| 11,482,657 | B2 | 10/2022 | Topaloglu et al. |
| 11,527,697 | B2 | 12/2022 | Shao et al. |
| 11,552,236 | B2 | 1/2023 | Gill et al. |
| 11,615,333 | B2 | 3/2023 | Hertzberg et al. |
| 11,641,785 | B2 | 5/2023 | Mergenthaler et al. |
| 2005/0258835 | A1 | 11/2005 | Saijyo et al. |
| 2019/0165244 | A1 | 5/2019 | Hertzberg et al. |
| 2021/0083168 | A1 | 3/2021 | Rosenblatt et al. |
| 2021/0234087 | A1 | 7/2021 | Topaloglu et al. |
| 2021/0241161 | A1 | 8/2021 | Hertzberg et al. |
| 2021/0408360 | A1 | 12/2021 | Lewandowski et al. |
| 2022/0058509 | A1 | 2/2022 | Hertzberg et al. |
| 2022/0199890 | A1* | 6/2022 | Orcutt .................... G06N 10/40 |
| 2022/0293845 | A1 | 9/2022 | Phung et al. |

FOREIGN PATENT DOCUMENTS

| | | | |
|---|---|---|---|
| AU | 2020224954 | B2 | 6/2023 |
| CA | 3181649 | A1 | 12/2021 |
| CN | 111373556 | A | 7/2020 |
| CN | 111373557 | A | 7/2020 |
| CN | 112400178 | A | 2/2021 |
| CN | 112513890 | A | 3/2021 |
| CN | 112567397 | A | 3/2021 |
| CN | 113366513 | A | 9/2021 |
| CN | 115669286 | A | 1/2023 |
| DE | 112018006053 | B4 | 11/2021 |
| EP | 3844686 | A1 | 7/2021 |
| EP | 3844687 | A1 | 7/2021 |
| EP | 3844688 | A1 | 7/2021 |
| EP | 3928262 | A1 | 12/2021 |
| EP | 4173055 | A1 | 5/2023 |
| GB | 2581311 | B | 2/2021 |
| IL | 298457 | A | 1/2023 |
| JP | 2021535592 | A | 12/2021 |
| JP | 2021535593 | A | 12/2021 |
| JP | 2021535596 | A | 12/2021 |
| JP | 2022521666 | A | 4/2022 |
| JP | 7139447 | B2 | 9/2022 |
| JP | 7220006 | B2 | 2/2023 |
| KR | 20230007482 | A | 1/2023 |
| WO | 2019105715 | A1 | 6/2019 |
| WO | 2019105716 | A1 | 6/2019 |
| WO | 2019233821 | A1 | 12/2019 |
| WO | 2020043594 | A1 | 3/2020 |
| WO | 2020043596 | A1 | 3/2020 |
| WO | 2020043597 | A1 | 3/2020 |
| WO | 2020169418 | A1 | 8/2020 |
| WO | 2021259712 | A1 | 12/2021 |
| WO | 2022129151 | A1 | 6/2022 |

OTHER PUBLICATIONS

J. B. Hertzberg et al., "Laser-annealing Josephson Junctions for Yielding Scaled-up Superconducting Quantum Processors," npj Quantum Information, Aug. 19, 2021, 8 pages, vol. 7, No. 129.

D. C. McKay et al., "Universal Gate for Fixed-Frequency Qubits via a Tunable Bus," Physical Review Applied, Dec. 12, 2016, 10 pages, vol. 6, No. 6.

C. Macklin et al., "A Near-Quantum-Limited Josephson Traveling-Wave Parametric Amplifier," Science, Sep. 3, 2015, pp. 307-310, vol. 350, No. 6258.

H. J. Mamin et al., "Merged-Element Transmons: Design and Qubit Performance," arXiv:2103.09163v2, Aug. 13, 2021, 8 pages.

F. Yan et al., "The Flux Qubit Revisited to Enhance Coherence and Reproducibility," Nature Communications, Nov. 3, 2016, 9 pages, vol. 7, No. 12964.

J. Stehlik et al., "Tunable Coupling Architecture for Fixed-Frequency Transmon Superconducting Qubits," Physical Review Letters, Aug. 20, 2021, 6 pages, vol. 127, No. 080505.

V. E. Manucharyan et al., "Fluxonium: Single Cooper Pair Circuit Free of Charge Offsets," arXiv:0906.0831v2, Oct. 20, 2009, 13 pages.

J. M. Gambetta et al., "A Superconducting Qubit with Purcell Protection and Tunable Coupling," arXiv:1009.4470v1, Sep. 22, 2010, 4 pages.

N. Bergeal et al., "Phase Preserving Amplification near the Quantum Limit with a Josephson Ring Modulator," arXiv:0912.3407v1, Dec. 17, 2009, 20 pages.

* cited by examiner

Figure 3A:
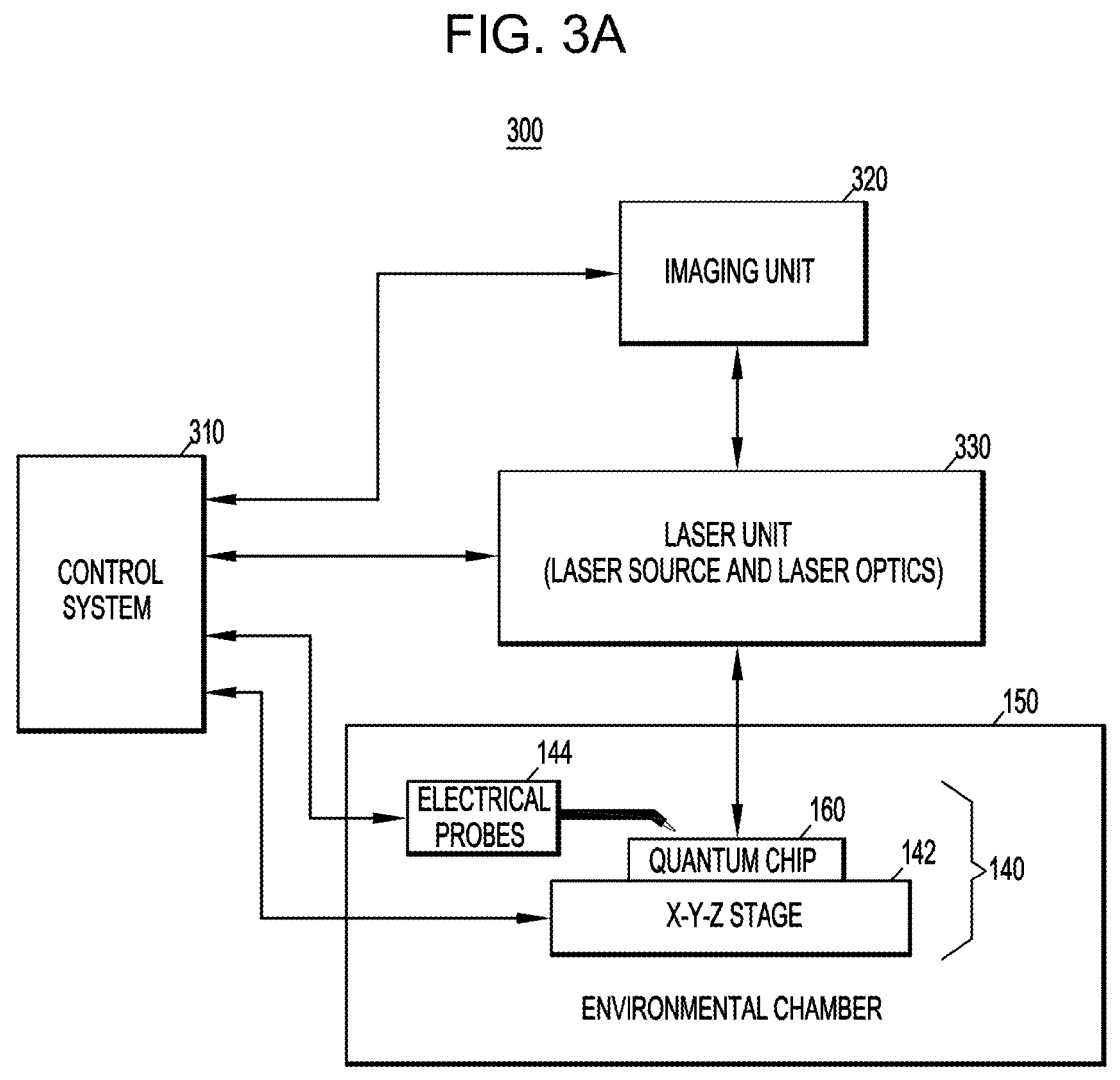

320 IMAGING UNIT

310 CONTROL SYSTEM

330 LASER UNIT (LASER SOURCE AND LASER OPTICS)

150

144 ELECTRICAL PROBES

160 QUANTUM CHIP

142 X-Y-Z STAGE

140

ENVIRONMENTAL CHAMBER

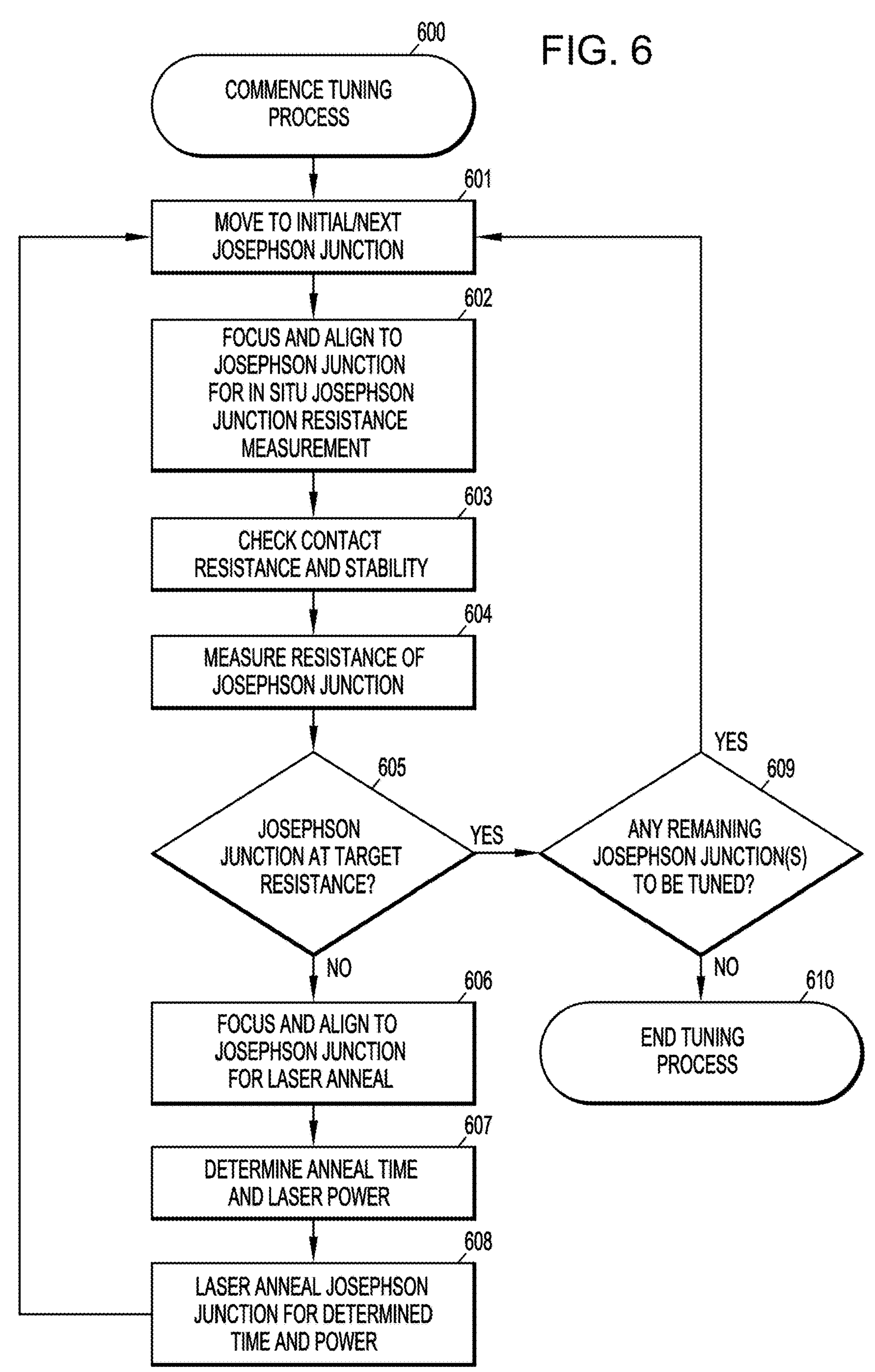

FIG. 6
600
COMMENCE TUNING PROCESS
601
MOVE TO INITIAL/NEXT JOSEPHSON JUNCTION
602
FOCUS AND ALIGN TO JOSEPHSON JUNCTION FOR IN SITU JOSEPHSON JUNCTION RESISTANCE MEASUREMENT
603
CHECK CONTACT RESISTANCE AND STABILITY
604
MEASURE RESISTANCE OF JOSEPHSON JUNCTION
605
JOSEPHSON JUNCTION AT TARGET RESISTANCE?
YES
NO
606
FOCUS AND ALIGN TO JOSEPHSON JUNCTION FOR LASER ANNEAL
607
DETERMINE ANNEAL TIME AND LASER POWER
608
LASER ANNEAL JOSEPHSON JUNCTION FOR DETERMINED TIME AND POWER
609
ANY REMAINING JOSEPHSON JUNCTION(S) TO BE TUNED?
YES
NO
610
END TUNING PROCESS

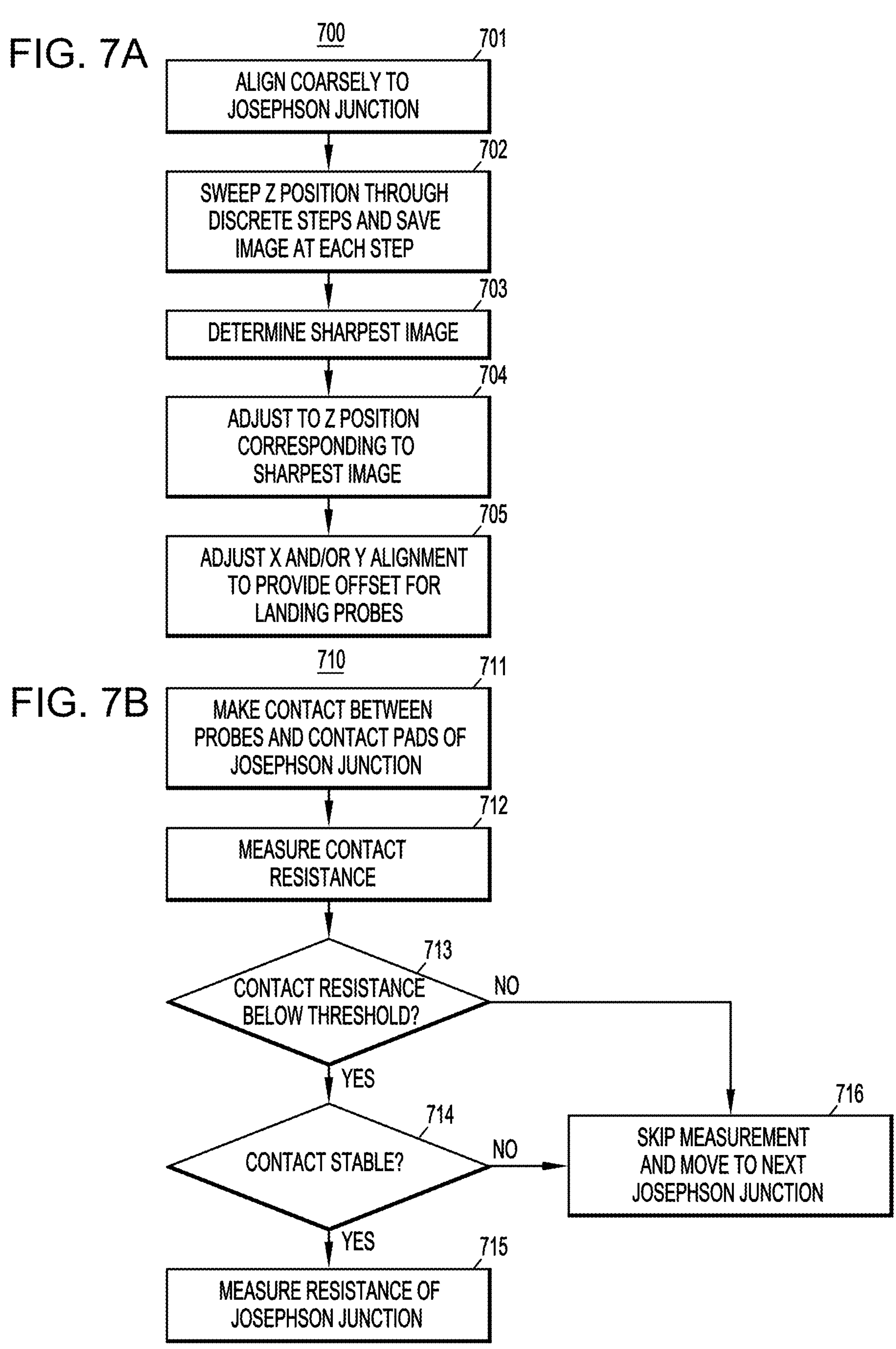
FIG. 7A
700
701
ALIGN COARSELY TO JOSEPHSON JUNCTION
702
SWEEP Z POSITION THROUGH DISCRETE STEPS AND SAVE IMAGE AT EACH STEP
703
DETERMINE SHARPEST IMAGE
704
ADJUST TO Z POSITION CORRESPONDING TO SHARPEST IMAGE
705
ADJUST X AND/OR Y ALIGNMENT TO PROVIDE OFFSET FOR LANDING PROBES
FIG. 7B
710
711
MAKE CONTACT BETWEEN PROBES AND CONTACT PADS OF JOSEPHSON JUNCTION
712
MEASURE CONTACT RESISTANCE
713
CONTACT RESISTANCE BELOW THRESHOLD?
NO
YES
714
CONTACT STABLE?
NO
716
SKIP MEASUREMENT AND MOVE TO NEXT JOSEPHSON JUNCTION
YES
715
MEASURE RESISTANCE OF JOSEPHSON JUNCTION

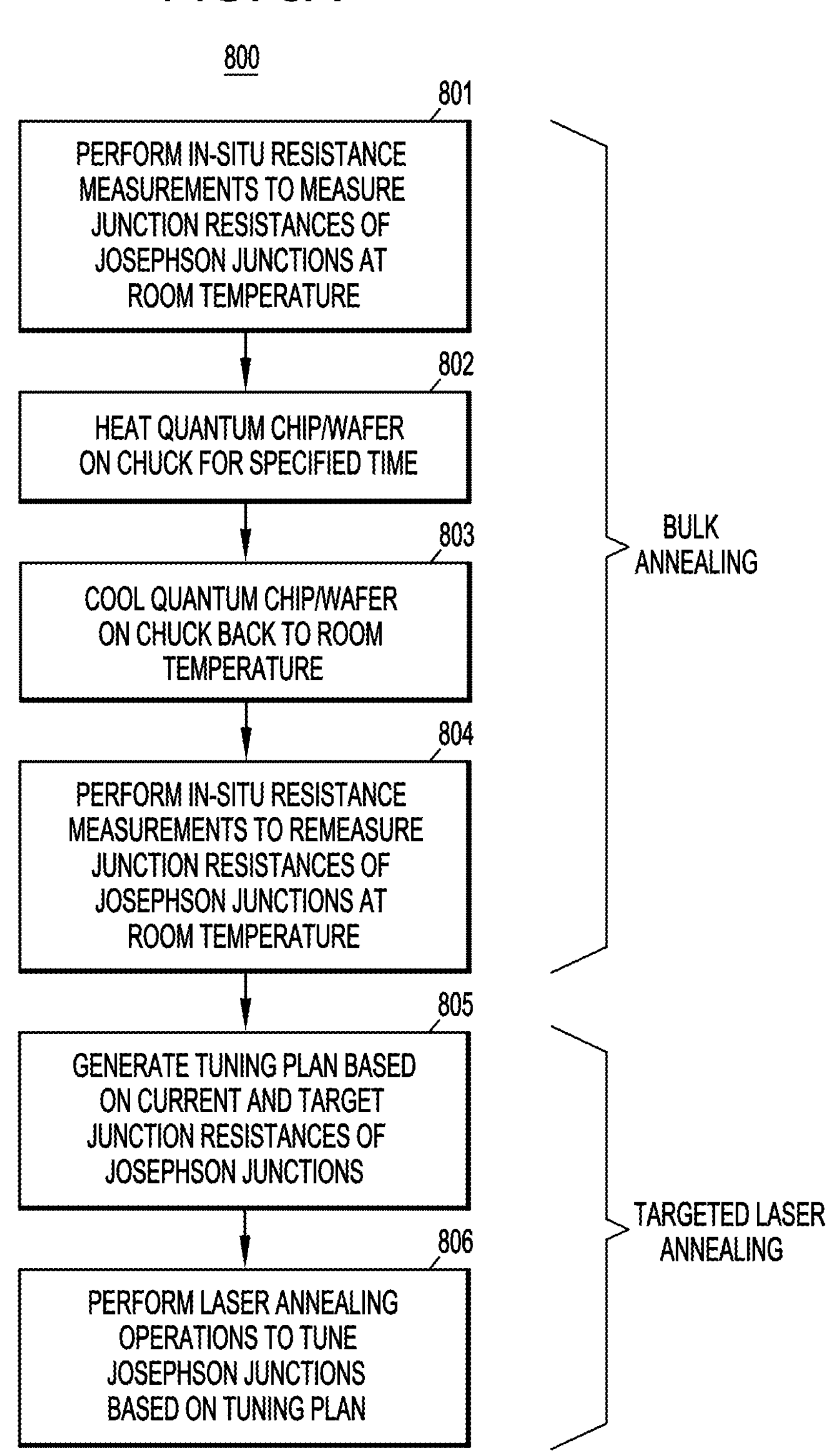
FIG. 8A
800
801
PERFORM IN-SITU RESISTANCE MEASUREMENTS TO MEASURE JUNCTION RESISTANCES OF JOSEPHSON JUNCTIONS AT ROOM TEMPERATURE
802
HEAT QUANTUM CHIP/WAFER ON CHUCK FOR SPECIFIED TIME
803
COOL QUANTUM CHIP/WAFER ON CHUCK BACK TO ROOM TEMPERATURE
804
PERFORM IN-SITU RESISTANCE MEASUREMENTS TO REMEASURE JUNCTION RESISTANCES OF JOSEPHSON JUNCTIONS AT ROOM TEMPERATURE
BULK ANNEALING
805
GENERATE TUNING PLAN BASED ON CURRENT AND TARGET JUNCTION RESISTANCES OF JOSEPHSON JUNCTIONS
806
PERFORM LASER ANNEALING OPERATIONS TO TUNE JOSEPHSON JUNCTIONS BASED ON TUNING PLAN
TARGETED LASER ANNEALING

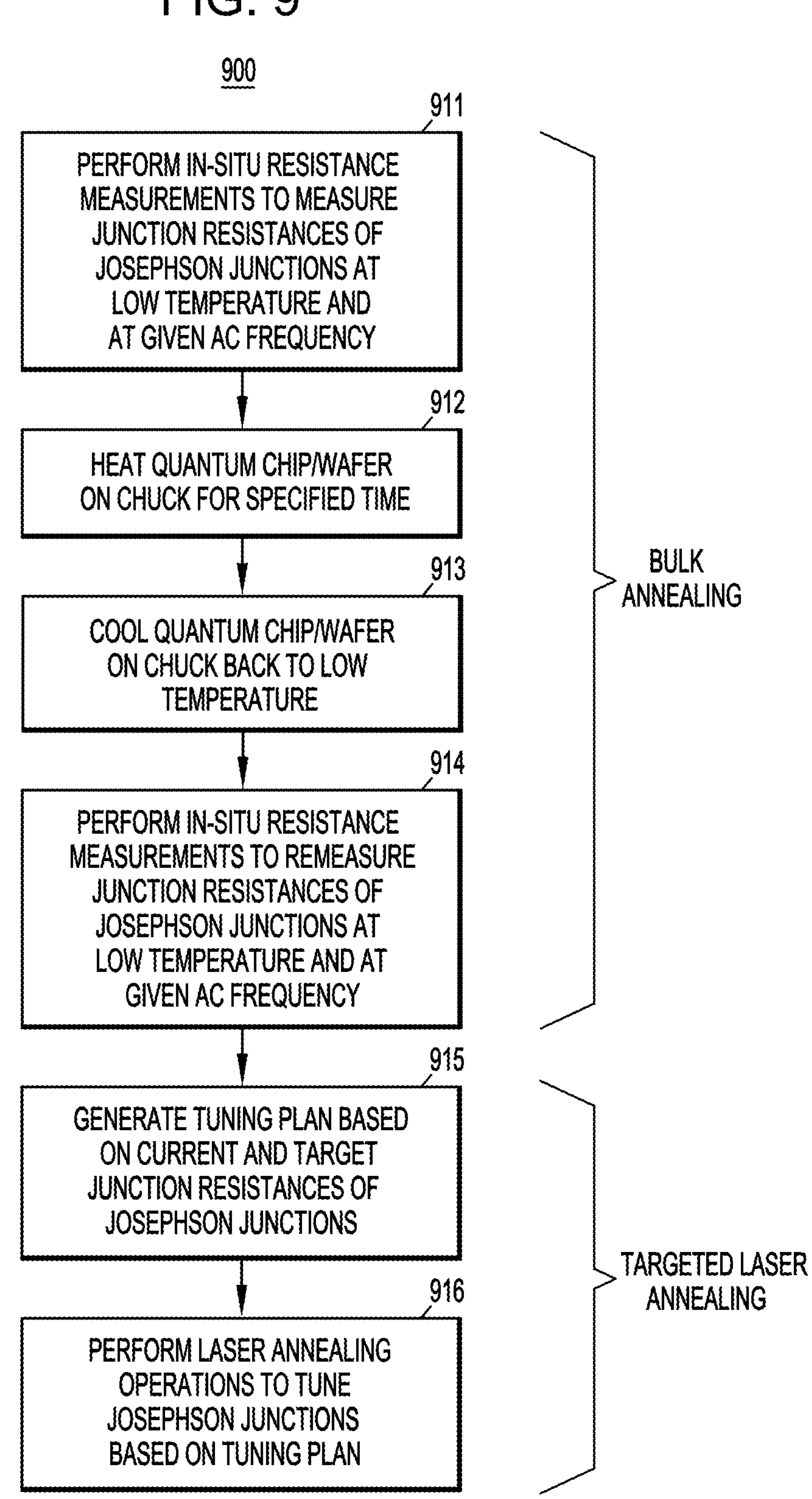
FIG. 9
900
911
PERFORM IN-SITU RESISTANCE MEASUREMENTS TO MEASURE JUNCTION RESISTANCES OF JOSEPHSON JUNCTIONS AT LOW TEMPERATURE AND AT GIVEN AC FREQUENCY
912
HEAT QUANTUM CHIP/WAFER ON CHUCK FOR SPECIFIED TIME
913
COOL QUANTUM CHIP/WAFER ON CHUCK BACK TO LOW TEMPERATURE
914
PERFORM IN-SITU RESISTANCE MEASUREMENTS TO REMEASURE JUNCTION RESISTANCES OF JOSEPHSON JUNCTIONS AT LOW TEMPERATURE AND AT GIVEN AC FREQUENCY
BULK ANNEALING
915
GENERATE TUNING PLAN BASED ON CURRENT AND TARGET JUNCTION RESISTANCES OF JOSEPHSON JUNCTIONS
916
PERFORM LASER ANNEALING OPERATIONS TO TUNE JOSEPHSON JUNCTIONS BASED ON TUNING PLAN
TARGETED LASER ANNEALING

OPTICAL APPARATUS FOR LASER ANNEALING

BACKGROUND

This disclosure relates generally to techniques for tuning Josephson junction devices and, in particular, the laser annealing systems and techniques for tuning tunnel junction resistances of Josephson junction devices. A quantum computing system can be implemented using superconducting circuit quantum electrodynamics (cQED) architectures that are constructed using quantum circuit components such as, e.g., superconducting quantum bits (e.g., fixed-frequency transmon quantum bits), superconducting quantum interference devices (SQUIDs), and other types of superconducting devices which comprise Josephson junction devices. In particular, superconducting quantum bits (qubits) are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures. A fixed-frequency qubit, such as a transmon qubit, has a transition frequency (denoted $f_{01}$) which corresponds to an energy difference between a ground state $|0\rangle$ and a first excited state $|1\rangle$ of the qubit. It is known that the transition frequency $f_{01}$ of a qubit can be estimated from the tunnel junction resistance (denoted $R_J$) of the Josephson junction of the qubit.

A solid-state quantum processor can include multiple superconducting qubits that are arranged in a given lattice structure (e.g., square lattice, heavy hexagonal lattice) to enable quantum information processing through quantum gate operations (e.g., single-qubit gate operations and multi-qubit gate operations) in which quantum information is generated and encoded in computational basis states (e.g., $|0\rangle$ and $|1\rangle$) of single qubits, superpositions of the computational basis states of single qubits, and/or entangled states of multiple qubits. Continuing technological advances in quantum processor design are enabling the rapid scaling of both the physical number of superconducting qubits and the computational capabilities of quantum processors. Indeed, while current state-of-the art quantum processors have greater than 50 qubits, it is anticipated that future quantum processors will have a much larger number of qubits, e.g., on the order of hundreds or thousands of qubits, or more.

Scaling the number of qubits (e.g., fixed frequency transmon qubits) in a qubit lattice, while maintaining high-fidelity quantum gate operations, remains a key challenge for quantum computing. For example, as superconducting quantum processors scale to larger numbers of qubits, frequency crowding within a qubit lattice becomes increasingly problematic since the transition frequencies of the qubits need to be precisely controlled to minimize gate errors that can arise from lattice frequency collisions (e.g., improper detuning between superconducting qubits can reduce the fidelity of multi-qubit gate entanglement operations). Due to semiconductor processing variabilities, however, the transition frequencies of superconducting qubits as fabricated can deviate from design targets.

In this regard, laser annealing techniques can be used to adjust qubit frequencies post-fabrication and thereby selectively tune fixed-frequency qubits of a given qubit lattice into desired frequency patterns. In particular, laser annealing techniques can be utilized to increase collision-free yield of fixed-frequency qubit lattices by selectively trimming (i.e., tuning) individual qubit frequencies, post-fabrication, by enabling localized thermal annealing the Josephson junctions of the qubits to thereby adjust and stabilize the tunnel junction resistance $R_J$ of the respective Josephson junctions (and correspondingly, the respective qubit transition frequencies $f_{01}$) with high precision. The tuning of qubit transition frequencies through laser thermal annealing, however, is non-trivial due to, e.g., inherent variabilities of the laser thermal anneal process itself and/or the equipment that is utilized to perform such laser thermal annealing, post fabrication, to tune the qubit transition frequencies in a given qubit lattice.

SUMMARY

Exemplary embodiments of the disclosure include optical apparatus for laser annealing. For example, in an exemplary embodiment, an optical microscope device comprises an optically integrated configuration of components for imaging a target device within a field of view of the optical microscope device, and for laser annealing the target device by generating a laser beam spot pattern from a laser beam received on an optical fiber from a remote laser source, and for controlling a duration of exposure of the laser beam spot pattern for laser annealing the target device.

Advantageously, the optical microscope device provides an integrated optical system for both laser annealing and optical visualization and characterization to precisely control and visualize laser illumination geometry and alignment for laser annealing operations.

In another exemplary embodiment, as may be combined with the preceding paragraph, the optical microscope device comprises a modular device which is configured for mounting to an electrical characterization system to enable in-situ electrical characterization of the target device in conjunction with laser annealing.

In another exemplary embodiment, as may be combined with the preceding paragraphs, the electrical characterization system comprises a wafer-scale prober unit.

Another exemplary embodiment includes an optical apparatus which comprises a collimator, an optical beam shaper, a first set of optical components, and an imager. The collimator is configured to receive an optical beam through an optical fiber coupled to an optical source and to generate a collimated optical beam. The optical beam shaper is configured to receive the collimated optical beam and to split the collimated optical beam into a plurality of optical beams in accordance with an optical beam pattern configured to laser anneal a target device. The first set of optical components is configured to receive the plurality of optical beams and to manipulate the plurality of optical beams with respect to the target device. The imager is configured to generate an image of the target device in a field of view of the optical apparatus.

Advantageously, the optical apparatus provides an integrated optical system for both laser annealing and optical visualization and characterization to precisely control and visualize laser illumination geometry and alignment for laser annealing operations.

Another exemplary embodiment includes a system which comprises a control system, and an optical apparatus. The optical apparatus comprises a collimator, an optical beam shaper, a first set of optical components, and an imager. The collimator is configured to receive an optical beam through an optical fiber coupled to an optical source and to generate a collimated optical beam. The optical beam shaper is configured to receive the collimated optical beam and to split the collimated optical beam into a plurality of optical beams in accordance with an optical beam pattern configured to laser anneal a target device. The first set of optical components is configured to receive the plurality of optical beams and to manipulate the plurality of optical beams with respect to the target device. The imager is configured to generate an image of the target device in a field of view of the optical apparatus. The control system controls at least a portion of the optical apparatus to enable laser annealing of the target device.

In another exemplary embodiment, as may be combined with the preceding paragraphs, the optical apparatus further comprises a power monitor configured to monitor a power level of the collimated optical beam.

In another exemplary embodiment, as may be combined with the preceding paragraphs, the optical apparatus comprises a modular apparatus wherein at least the collimator, the optical beam shaper, the set of optical components, and the imager are arranged in a modular configuration to portably integrate with an electrical characterization system configured to measure one or more electrical characteristics of the target device in conjunction with the laser annealing caused by the optical source.

In another exemplary embodiment, as may be combined with the preceding paragraphs, the optical apparatus comprises a beam shutter operatively coupled between the collimator and the optical beam shaper and configured to affect an exposure time for laser annealing the target device.

In another exemplary embodiment, as may be combined with the preceding paragraphs, the optical beam shaper of the optical apparatus further comprises a diffractive optical element configured to selectively determine the optical beam pattern for laser annealing the target device.

In another exemplary embodiment, as may be combined with the preceding paragraphs, the control system is configured to process the image generated by the imager and cause alignment of the target device in the field of view of the optical apparatus to the optical beam pattern for laser annealing the target device.

Other embodiments will be described in the following detailed description of exemplary embodiments, which is to be read in conjunction with the accompanying figures.

BRIEF DESCRIPTION OF THE DRAWINGS

FIG. 2A schematically illustrates a laser annealing apparatus comprising a modular optical scope unit, according to an exemplary embodiment of the disclosure.

FIG. 3A schematically illustrates a laser annealing system, according to another exemplary embodiment of the disclosure.

FIG. 6 illustrates a flow diagram of a method for performing an iterative laser annealing process to progressively shift junction resistances of Josephson junctions to respective target junction resistances, according to an exemplary embodiment of the disclosure.

FIG. 7A illustrates a flow diagram of a method for focusing and aligning to a target Josephson junction for the purpose of performing an in-situ Josephson junction resistance measurement, according to an exemplary embodiment of the disclosure.

FIG. 7B illustrates a flow diagram of a method for performing contact resistance and contact stability check operations prior to performing an in-situ Josephson junction resistance measurement, according to an exemplary embodiment of the disclosure.

FIG. 8A is a flow diagram of a method of utilizing a laser annealing apparatus to perform annealing operations in conjunction with in-situ DC resistance measurements to tune junction resistances of Josephson junctions, according to an exemplary embodiment of the disclosure.

FIG. 9 is a flow diagram of a method of utilizing a laser annealing apparatus to perform annealing operations in conjunction with in-situ AC resistance measurements to tune junction resistances of Josephson junctions, according to an exemplary embodiment of the disclosure.

DETAILED DESCRIPTION

Figure 1:
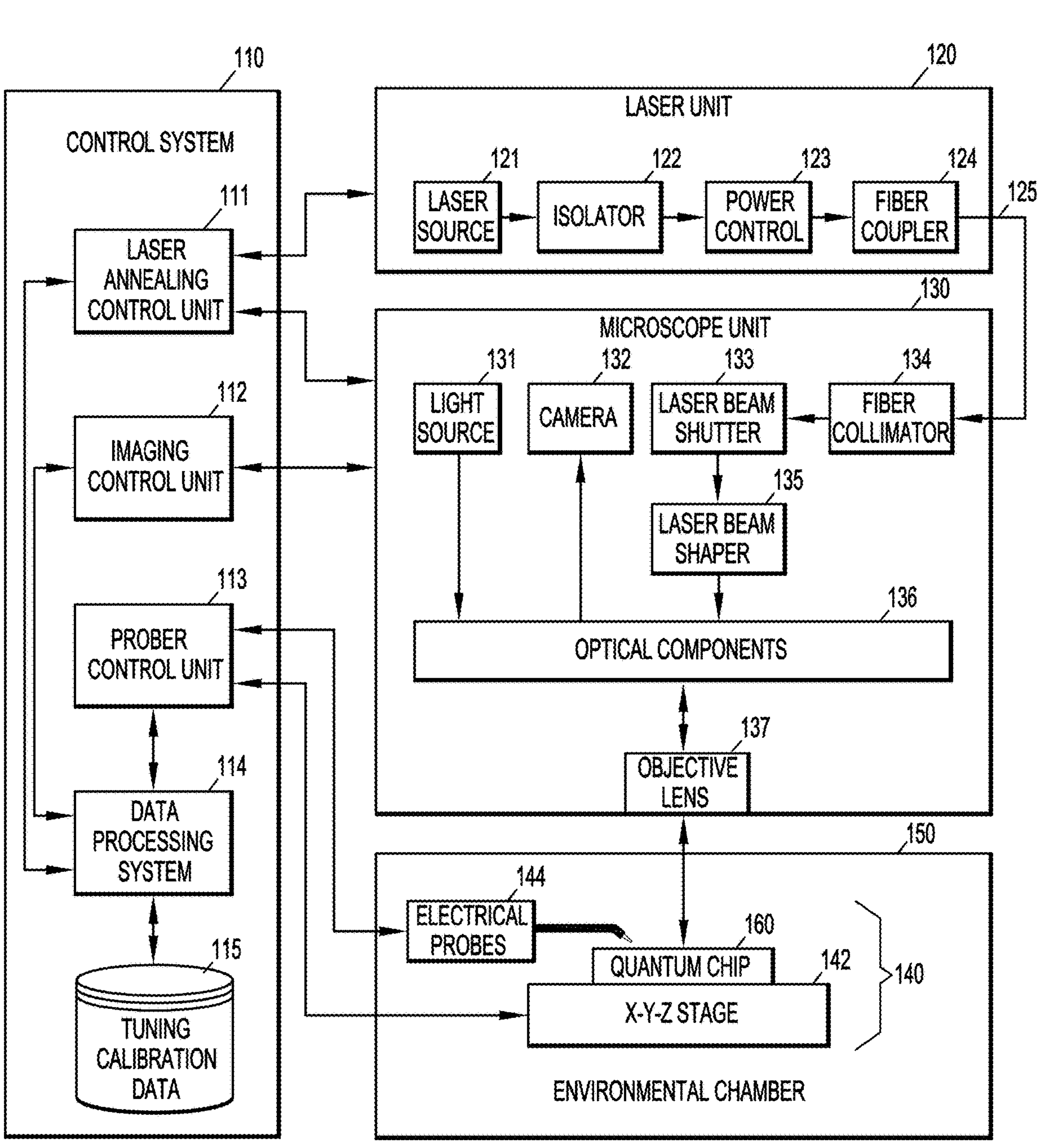
FIG. 1 schematically illustrates a laser annealing system, according to an exemplary embodiment of the disclosure.

Exemplary embodiments of the disclosure will now be described in further detail with regard to laser annealing apparatus and techniques for utilizing the laser annealing apparatus for laser tuning junction resistances of superconducting tunnel junction devices (e.g., Josephson junctions of superconducting quantum bit devices). In general, exemplary embodiments of the disclosure include laser annealing apparatus which comprise optical apparatus, and electrical characterization apparatus. The optical apparatus and the electrical characterization apparatus comprise an integrated configuration to perform laser annealing operations for tuning junction resistances of superconducting tunnel junction devices on a quantum chip, and to perform in-situ resistance measurements to measure the junction resistances of the superconducting tunnel junction devices on the quantum chip.

More specifically, in some embodiments, the optical apparatus is utilized for laser annealing operations and optical characterization. The laser annealing operations include, e.g., generating a laser beam, performing beam shaping to generate a desired laser beam spot pattern for laser annealing, controlling laser beam exposure times to control anneal times, etc. The optical characterization comprises, e.g., enabling computer vision inspection of devices being laser annealed, and performing imaging and pattern recognition to support alignment of target devices to the laser beam spot patterns for laser annealing, and alignment of electrical probes of the electrical characterization apparatus to contacts of target devices for electrical characterization operations (e.g., measuring junction resistances of Josephson junctions), etc. Further, in some embodiments the electrical characterization apparatus is configured to, e.g., enable electrical characterization of target devices (e.g., Josephson junctions) before, during, and after laser tuning. For example, the integration of the electrical characterization apparatus enables in-situ resistance measurements to be performed during iterative laser annealing operations on Josephson junctions to track a progression of resistance shifts of the junction resistances of the Josephson junctions to respective target junction resistances.

In some embodiments of a laser annealing apparatus, the optical apparatus comprises a discrete optical configuration (e.g., table-top configuration), wherein the optical apparatus comprises a separate laser unit and imaging unit which are optically coupled. The laser unit comprises a laser source and optical components to control laser annealing operations (e.g., generating and shaping a laser beam into a desired laser beam spot pattern for laser annealing, controlling laser beam exposure times to control anneal times, etc.). The imaging unit is configured for imaging a sample in a field of view of the laser unit to enable, e.g., computer vision inspection and alignment operations.

In some embodiments of a laser annealing apparatus, the optical apparatus comprises a laser unit and a modular optical scope unit (e.g., modular microscope unit), wherein the laser unit and the modular optical scope unit are optically coupled by an optical fiber. The laser unit comprises a laser source that is configured to generate a laser beam. The modular optical scope unit comprises an optically integrated configuration of an imaging unit, optical components, a laser beam shaping device, and a laser beam focusing element. The laser beam that is generated by the laser unit is transmitted via the optical fiber to the modular optical scope unit. In such a configuration, the modular optical scope is configured to perform various laser annealing and optical characterization functions such as beam shaping the laser beam (which is received from the laser unit) to generate a desired laser beam spot pattern for laser annealing, controlling laser beam exposure times to control anneal times, imaging for pattern image recognition to support computer vision inspection operations, laser beam and electrical probe alignment operations, etc.

In all exemplary embodiments of a laser annealing apparatus, the integration of the optical apparatus and the electrical characterization apparatus enables the integration of laser tuning of superconducting tunnel junction devices (e.g., Josephson junctions) and in-situ electrical characterization of the superconducting tunnel junction devices (e.g., measuring junction resistance measurements) to support the laser tuning operations (e.g. tracking progression of tuning over multiple iterations of laser annealing) in a way that increases the throughput of laser tuning operations. The integration of laser tuning and in-situ electrical characterization enables increased throughput and scaling of laser tuning processes, such as LASIQ processes for laser annealing Josephson junctions of superconducting qubits to tune (e.g., trim) transition frequencies of the superconducting qubits.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs. In addition, the terms "about" or "substantially" as used herein with regard to, e.g., percentages, ranges, etc., are meant to denote being close or approximate to, but not exactly. For example, the term "about" or "substantially" as used herein implies that a small margin of error may be present, such as 1% or less than the stated amount.

It is to be further understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Further, the term "quantum chip" as used herein is meant to broadly refer to any device which comprises qubits and possibly other quantum devices. For example, a quantum chip can be semiconductor die which comprises an array (lattice) of qubits, which is fabricated on a wafer comprising multiple dies, and which can be diced (cut) from the wafer using a die singulation process to provide a singulated die. In some instance, a quantum chip can be a wafer with multiple semiconductor die. In the context of quantum computing, a quantum chip may comprise one or more processors for a quantum computer.

Moreover, the term "shot" as used herein denotes a laser anneal operation that is performed by applying laser power to a target element (e.g., Josephson junction) for a specified duration (anneal time) to tune the target element. In the context of exemplary embodiments of the disclosure as discussed herein, laser tuning methods are provided to tune junction resistances of Josephson junctions in a progressive and incremental manner wherein multiple "shots" are applied to a given Josephson junction to tune the junction resistance of the Josephson junction to a target junction resistance, which is to be contrasted with conventional approaches that tune a Josephson junction to a target junction resistance using only one laser shot.

The term "iterate" or "iteratively" used herein and in the context of a laser annealing process is meant to refer to the process which comprises a single "shot" along with associated control, measurement and computation by a LASIQ computer system and apparatus to determine a target anneal time and power for performing the anneal shot. A laser annealing iteration, or LASIQ iteration, therefore refers to the entire process by which a Josephson junction is measured, the anneal power and time is determined, and the anneal shot is performed. In this sense, a single iteration involves an entire sequence of the laser annealing system and apparatus as it pertains to one step of a progressive approach to a resistance target for one Josephson junction. The tuning of one junction to completion (i.e., reaching its target resistance) may therefore be said to progress "iteratively." The term "iterative process" as used herein, is meant to generally refer to a set of iterations, as applicable to one or more qubits, or the like, comprising Josephson junctions, whereby the one or more qubits are tuned with the purpose of approaching their respective targets.

The term "progressive" or "progressively" as used herein and in the context of a laser annealing process, is meant to refer to the gradual approach of shifting a junction resistance of a Josephson junction to a respective target resistance. Such a progressive approach is a result of multiple annealing iterations, each of which include a laser shot to alter the junction resistance in the desired direction towards the target resistance. Additionally, such a progressive approach is asymptotic, in the sense that the tuning rate nominally decreases as the junction resistance of a given Josephson junction approaches nearer to its respective target resistance.

The term "adaptive" or "adaptively" as used herein and in the context of a laser annealing process, is meant to refer to the appropriate selection of laser annealing parameters, including such parameters as laser annealing time and annealing power, as it pertains to a laser shot, to allow the Josephson junction resistances to monotonically and asymptotically approach their respective resistance targets. The adaptive nature of the laser annealing iterations is achieved using methods described herein, whereby the laser anneal time and power are selected based on historical reconstruction of the tuning progression of the specific junction. The methods described herein account for the rate of historical tuning of the specific junction being tuned, thereby mitigating the risk of missing resistance targets (e.g., by using laser shots that have excess time such that the junction resistance is tuned beyond the desired resistance target).

The term "round-robin" as used herein and in the context of a laser annealing process for tuning the Josephson junctions of qubits, is meant to refer to a tuning process in which the Josephson junctions of, e.g., all qubits on a multi-qubit device undergo the laser annealing process in succession, and which may be followed by another round-robin or multiple round-robins in succession. Such round-robins may be continuously performed until all qubits on the multi-qubit device reach their respective targets. For example, a singulated quantum chip may comprise a number of qubit devices (e.g., 100 qubits, denoted Q1, Q2, Q3, . . . , Q100) comprising Josephson junctions. In an exemplary embodiment of a tuning method, Q1 will first be tuned with one or more annealing iterations, as desired. The process will proceed to Q2, where one or more annealing iterations may be performed, as desired. The process will then proceed to Q3, etc., until finally Q100 is tuned with one or more annealing iterations, as desired. The entire process from Q1 to Q100 is defined as one round-robin. After this first round-robin, the process may return to Q1, and will repeat again until Q100 is reached. The process of successive round-robins may provide a means of time control and delay between iterations or sets of iterations, such that the Josephson junctions may be permitted to relax to their final junction resistances prior to the next annealing iteration or set of iterations.

FIG. 1 schematically illustrates a laser annealing system 100 for tuning Josephson junctions, according to an exemplary embodiment of the disclosure. In some embodiments, the laser annealing system 100 is configured to implement LASIQ (Laser Annealing of Stochastically Impaired Qubits) tuning methods for laser annealing of Josephson junctions of qubits, post-fabrication, to adjust and stabilize the junction resistances $R_J$ and thereby selectively tune the individual qubit frequencies via laser thermal annealing of the respective Josephson junctions. As schematically shown in FIG. 1, the laser annealing system 100 comprises a control system 110, a laser unit 120, an optical fiber 125, a microscope unit 130, a prober unit 140, and optional environmental chamber 150.

The control system 110 comprises a laser annealing control unit 111, an imaging control unit 112, a prober control unit 113, a data processing system 114, and a database of tuning calibration data 115. The laser unit 120 comprises a laser source 121, an isolator 122, a laser power control block 123, and a fiber coupler 124. The microscope unit 130 comprises a light source 131, a camera 132, a laser beam shutter 133, a fiber collimator 134, a laser beam shaper 135, a plurality of optical components 136, and an objective lens 137. The prober unit 140 comprises an X-Y-Z stage 142, and electrical probes 144. A quantum chip 160 (or any other similar device under test) can be mounted to the X-Y-Z stage. In some embodiments, the quantum chip comprises a lattice of superconducting qubits, where each superconducting qubit comprises at least one respective Josephson junction which can be annealed using the laser annealing system 100 to tune the junction resistance and, thus, tune the transition frequency of the superconducting qubit, post-fabrication.

In some embodiments, the laser unit 120 and the microscope unit 130 comprise modular units that are coupled together via the optical fiber 125. In some embodiments, the optical fiber 125 comprises a single-mode (SM) polarization-maintaining (PM) optical fiber, which is configured to preserve a linear polarization of linearly polarized light that is injected into the optical fiber 125 by the laser unit 120 and propagated to the microscope unit 130. The microscope unit 130 comprises a modular optical unit which comprises visible light and laser optical components. The microscope unit 130 can be integrated onto the prober unit 140 (e.g., a wafer-scale prober). In this regard, in some embodiments, the laser unit 120, the microscope unit 130, and the prober unit 140 can be physically coupled/attached to each other to form an integrated laser annealing apparatus which is configured to perform laser anneal operations for tuning junction resistances of Josephson junctions, as well as performing in-situ junction resistance measurements, under the control of the control system 110. In some embodiments, the control system 110 is operatively/communicatively coupled to the laser unit 120, the microscope unit 130, and the prober unit 140 via wires and/or wirelessly. The control system 110 comprises hardware and/or software for automated control of various operations of the laser unit 120, the microscope unit 130, and the prober unit 140 of the laser annealing system 100.

The laser unit 120 is configured to generate a laser beam that is used by the microscope unit 130 to generate a laser beam pattern which comprises a single or multi-spot beam pattern for laser annealing a given Josephson junction. In some embodiments, the laser source 121 comprises a solid-state diode pump to generate laser energy, and a laser head to generate a focused laser beam from the laser energy emitted from the solid-state diode pump. In some embodiments, the diode pump comprises a 532 nanometer (nm) (frequency doubled) diode-pumped solid-state laser (e.g., a second harmonic generation (SHG) laser). In some embodiments, the power level of the laser source 121 (e.g., solid-state diode pump) can be adjusted by the control system 110. For example, the power level of the laser source 121 can be set to one of a plurality of different power level settings (e.g., lower power, medium power, high power settings). The isolator 122 is configured to provide polarization cleanup and optical isolation to mitigate unwanted feedback to the laser head of the laser source 121.

The laser power control block 123 is configured to actively control and calibrate the power of the focused laser beam. For example, in some embodiments, the laser power control block 123 comprises a half-wave plate, and a polarizing beam-splitter (PBS) coupled to a dump. The half-wave plate is configured to shift the polarization direction of the laser beam output from the isolator 122. The laser power control block 123 further comprises a power monitor which comprises, e.g., an optical wedge that is configured to divert some laser beam power to a silicon photodiode. The silicon photodiode generates an electrical signal that is indicative of the laser power level, and the electrical signal is feedback to the control system 110 (e.g., the laser annealing control unit 111), the control system 110 generates control signals that are applied to the laser power control block 123 to adjustably control the laser power, as directed, for laser tuning of Josephson junctions. More specifically, in some embodiments, the power level of the laser beam can be coarsely adjusted by controlling the power output of the laser source 121, while the power level of the laser beam can be finely adjusted by operation of the laser power control block 123.

For example, in some embodiments, the half-wave plate of the laser power control block 123 is configured to shift the polarization direction of the laser beam output from the isolator 122, and the half-wave plate comprises an adjustable rotation, which can be electronically-controlled via the laser annealing control unit 111 to adjust a total attenuation by rotating the polarization incident on the polarizing beam splitter to the desired power level. In some embodiments, the polarizing beam splitter of the laser power control block 123 comprises an optical filter that allows a specific polarization of light waves associated with the laser beam to pass through the optical filter and blocks light waves of other polarizations, to thereby generate a laser beam with well-defined polarized light.

The polarized laser light generated by the laser unit 120 is coupled into the single-mode polarizing-maintaining optical fiber 125 (e.g., single-mode polarizing-maintaining optical fiber) via the optical fiber coupler 124, and propagates to the microscope unit 130. In the microscope unit 130, the fiber collimator 134 (e.g., collimating lens) is configured to transform the laser light which is output from the optical fiber 125 into a free-space collimated beam. In some embodiments, the microscope unit 130 comprises a power monitor which comprises, e.g., a beam sampler (e.g., beam splitter) and photodiode, to monitor the power of the collimated laser beam to enable precise exposure control downstream from the power control/adjustment mechanisms provided by the laser unit 120.

Furthermore, in the microscope unit 130, the laser beam shutter 133 comprises an electronic shutter that is operated under control of, e.g., the laser annealing control unit 111 of the control system 110, to control the time duration of laser exposure when annealing a given Josephson junction. For example, the laser beam shutter 133 can be opened for a given duration of time when annealing a target Josephson junction to allow annealing laser beams to be projected onto the quantum chip 160 in proximity to the target Josephson junction, and then automatically close after the given duration of time. In this regard, the laser power level and the pulse duration (laser exposure) can be controlled to achieve a desired change (e.g., decrease) in the resistance of the annealed Josephson junction.

The laser beam shaper 135 is configured to split the collimated laser beam (which passes through the laser beam shutter 133) into two or more laser beams with slightly different angles relative to one another. In some embodiments, the laser beam shaper 135 comprises a diffractive optical element (DOE), such as a diffractive beam splitter which splits a single laser beam into several beams (diffraction orders) in a predefined configuration. The diffractive beam splitter comprises a holographic optical element that imparts a precise angle (e.g., a 0.5 degree shift) to the incoming laser beam in plus and minus angular directions relative to a reference plane, to thereby generate a plurality of outgoing laser beams.

The number of laser beams generated by the laser beam shaper 135 can vary depending on the given application. For example, in some embodiments, laser beam shaper 135 comprises a 2-by-2 diffractive beam splitter, which splits the single collimated laser beam into four separate laser beams, which results in a final quad-spot illumination pattern that is projected onto the surface of the quantum chip 160 at a target location, an exemplary embodiment of which will be discussed below in conjunction with FIG. 7D. In some embodiments, the laser beam shaper 135 can be switched either manually or automatically with a different diffractive beam splitter (e.g., a plurality of DOEs on a rotary stage) to obtain a different laser spot pattern, as desired. In this regard, different diffractive beam splitters can be selected for use to generate any desired number (e.g., 2, 3, 5, 6, etc.) of laser beams with defined illumination patterns tailored to different applications.

The microscope unit 130 implements the light source 131 and the camera 132 for illuminating and viewing target features (e.g., qubits and corresponding Josephson junctions) on the surface of the quantum chip 160 within a given field of view (FOV) of the microscope unit 130. In some embodiments, the light source 131 comprises any suitable light generating device including one or more light emitting diodes (LEDs) with desired photonic wavelengths, a monochromatic light source, etc. The light source 131 together with some of the optical components 136 in the optical viewing path implement Kohler illumination to create uniform illumination of the target features in the FOV of the microscope unit 130 and to ensure that an image of the light source 131 is not visible in the resulting images captured by the camera 132.

In some embodiments, the camera 132 comprises a charge-coupled device (CCD) image sensor, or an infrared (IR) complementary metal oxide semiconductor (CMOS) image sensor. The camera 132 is utilized to capture images of a target region on the surface of the quantum chip 160 to facilitate, e.g., aligning the electrical probes 144 to contact electrodes when performing in-situ Josephson junction resistance measurements, aligning the laser beam pattern onto the target region when performing laser annealing operations, etc. For example, in some embodiments, the Josephson junction of a given qubit is aligned to the center of the FOV of the microscope unit 130 using pattern recognition to, e.g., a Josephson junction template image. Also, in some embodiments, more than one camera may be used in parallel, by splitting the image path using a beam splitter and using, for example, an IR CMOS camera in addition to a visible wavelength camera, which may be used for process monitoring (e.g., a wide FOV for inspection, process tracking, or the like).

The optical components 136 include various types of optical components for directing, reflecting, focusing, modifying, and shaping, etc., the optical signals (e.g., laser beams for annealing, and visible light/IR light for viewing) as needed for the given application. For example, the optical components 136 include components such as a mirror, beam splitters, filters, polarizers, and various lenses such as a tube lens, an objective lens, relay lenses, etc.). The objective lens 137 is the lens that is located closest to the device under test (quantum chip 160) and serves to provide the base magnification for generating a magnified image that is viewed by the camera 132, and to project the annealing laser beam pattern (e.g., quad-spot pattern) onto the surface of the quantum chip 160. In some embodiments, the objective lens 137 comprises a long working distance (WD) objective lens. In an exemplary non-limiting embodiment, the objective lens 137 (together with an optional second objective lens) is configured to condense the laser beams and multi-spot pattern by 4×, while providing 20× image magnification.

The prober unit 140 is configured to automatically move the position of the quantum chip 160 during a laser annealing process to align a target Josephson junction of a given qubit within the FOV of the microscope unit 130 to perform an in-situ Josephson junction resistance measurement and a laser anneal of the target Josephson junction. In particular, the quantum chip 160 is mounted to the automated X-Y-Z stage 142 which is controllably moved in three dimensions to align features of the quantum chip 160 within the FOV of the microscope unit 130 and enable contact between the electrical probes 144 and contact pads on the quantum chip 160. For example, in some embodiments, during a laser anneal process, a target Josephson junction of a given qubit is aligned to the center of the FOV of the microscope unit 130 using an automated pattern recognition process in which features of an image captured by the camera 132 are automatically aligned to corresponding features of a template image to ensure proper positioning of the target Josephson junction and associated contact pads. In particular, an alignment process is performed to ensure accurate registration between the contact pads of the target Josephson junction and the electrical probes 144 when performing an in-situ Josephson junction resistance measurement. In addition, an alignment process is performed to ensure a proper alignment of the target Josephson junction and a laser spot pattern when performing a laser anneal operation.

As noted above, the electrical probes 144 are implemented to perform in-situ Josephson junction resistance measurements during a laser anneal process. In particular, in-situ Josephson junction resistance measurements are performed in between laser annealing operations (shots) to track the tuning progress of the Josephson junctions of the qubits during a multi-step (i.e., iterative) anneal process in which the Josephson junctions are progressively tuned. In some embodiments, the electrical probes 144 comprise two pairs of probes, which are configured to perform a 4-wire resistance measurement (or Kelvin resistance measurement) to more precisely measure the junction resistance of a Josephson junction. In general, a 4-wire (Kelvin) resistance measurement involves determining the resistance of a given Josephson junction by measuring a current (I) flow through the junction as well as a voltage (V) drop across the junction, and determining the junction resistance $R_J$ from Ohm's Law, i.e., $R_J=V/I$.

In some embodiments, the electrical probes 144 comprise a probe card that is mechanically mounted in a fixed position to the prober unit 140. In some embodiments, the integration of the microscope unit 130 and the prober unit 140 is configured to ensure that a sample imaging plane and a laser focal plane are substantially identical, while a probing plane is displaced from the sample imaging plane by a present amount, e.g., 70 microns, 80 microns, etc. In this configuration, the electrical probes 144 are fixedly displaced from the image plane, and the Z position of the X-Y-Z stage 142 (with the quantum chip 160 mounted thereon) is moved into a default contact position to make electrical contact between the electrical probes 144 and target contact pads on the quantum chip 160, to perform an in-situ Josephson junction resistance measurement. In some embodiments, the microscope unit 130 may also be mounted on its own X-Y-Z stage and may be additionally moved with those corresponding X, Y, and Z degrees of freedom.

In some embodiments, in order to image, electrically characterize, and anneal Josephson junctions, the X-Y-Z stage is set at various positions such that these functions may be safely and effectively performed. We herein use the terms "contact position," "anneal position," and "safety position" to denote various positions of the X-Y-Z stage.

By "contact position," as used herein and in the context of laser annealing system 100, is meant to refer to the position of the X-Y-Z stage 142 such that the sample (i.e., quantum chip 160) is in mechanical and electrical contact with the probes. That is to say, the surface of the sample is substantially identical to the probing plane. In this "contact position" configuration, electrical characterization may take place, which typically involves a 4-wire (Kelvin) resistance measurement. Each annealing iteration will typically involve a junction resistance measurement, where the X-Y-Z stage 142 is brought into the "contact position" prior to subsequent annealing.

The term "anneal position," as used herein and in the context of laser annealing system 100, is meant to refer to the Z position of the X-Y-Z stage 142 such that the surface of the sample (i.e., quantum chip 160) is at the focal plane of the laser annealing beam. In an exemplary embodiment, at the "anneal position," the surface of the sample (i.e., quantum chip 160) is substantially identical to the imaging plane, such that both imaging and annealing occurs at the same Z position of the X-Y-Z stage 142, or stated equivalently, the sample and laser beam may be both viewed in focus simultaneously by the imaging system. Additionally, at the "anneal position," pattern recognition and corrective alignment may take place, such that the junction is correctly centered at the FOV prior to annealing. It is also at the anneal position which visual characterization, inspection, and the like, may be performed to determine whether the chip is physically suitable for use as a chip candidate. Nominally, the "anneal position" may be chosen to be a fixed difference from the "contact position," which is herein defined as the "separation distance," which may be, for example, 70 microns, 80 microns, etc., and may be selected by the operator as desired.

The term "safety position," as used herein and in the context of laser annealing system 100, is meant to refer to a large displacement of the Z position of the X-Y-Z stage 142 such that the surface of the sample (i.e., quantum chip 160) is safely displaced from the "contact position" such that the tallest surface feature of the sample will not cross the probing plane, or stated equivalently, no feature on the sample intersects the probing plane. In this way, regardless of the X-position or Y-position that is chosen on the sample, the probes suffer no risk of damage due to impact with any surface feature while the X-Y-Z stage 142 is in the "safety position."

In an exemplary embodiment, the position of the probe card is fixed in the Z position, and the "separation distance" is selected to be 70 microns, that is, the "anneal position" is 70 microns below the "contact position." Additionally, the "safety position" may be chosen (for example) to be 1000 microns or larger, or a value that is sufficiently larger than the height of any feature on the sample. When the apparatus is initialized, the relative positions of the sample plane, the probing plane, imaging plane and laser annealing plane are not known a priori, and any operation performed using the laser annealing system 100 may exhibit, for example, image defocusing, poor electrical contact during probing, and/or poor annealing performance. Therefore, an initialization protocol must be performed to ensure that the contact position, anneal position, and safety position is well defined. In an exemplary embodiment, to define these positions, the X-Y-Z stage 142 may be programmed to move to a safe location, either on a test chip, an initialization chip, or the like, where a clean conducting surface (e.g., contact pads) is available under the probes. In this exemplary embodiment, a dedicated initialization chip with an array of conducting contact pads are available to safely contact the electrical probes 144. The X-Y-Z stage 142 is subsequently incremented (e.g., in 2-micron increments) in the Z position, towards the electrical probes 144, and the contact resistance is checked for each increment until a contact threshold is realized (e.g., 100 ohms, or another threshold as desired), which indicates successful contact between the sample and the probing plane, or equivalently, the sample plane and probing plane are co-located, and the X-Y-Z stage 142 is in the "contact position." Subsequent to determining the contact position, the X-Y-Z stage 142 is lowered in the Z position by the desired 70 microns "separation distance," such that the X-Y-Z stage 142 is in "alignment position." However, it may be the case the image focal plane is not yet at a substantially identical position as the sample surface. In this case, the microscope unit may be adjusted, either manually using a Z focus adjustment, or automatically (in the case where the microscope is mounted on its own X-Y-Z stage, and controlled by the imaging control unit 112), such that the imaging focal plane is made substantially identical to the sample plane. Using this protocol, the "anneal position" thus corresponds to the sample surface being in focus in the microscope unit 130, and both imaging and annealing may now occur at the "anneal position." In the case where electrical measurement is desired, reliable probing may subsequently be implemented by simply incrementing the Z position of the X-Y-Z stage 142 by 70 microns (i.e., the "separation distance"), or more, as some level of overtravel is desirable for robust electrical contact. Furthermore, a "safety position" may be defined, such that when moving between qubits, or other features on the quantum chip 160, the X-Y-Z stage 142 first moves to its safety position, then moves to the X and Y-position of the desired feature, then moves to either the "anneal position" for imaging/tuning, or to the "contact position" for electrical characterization. This initialization protocol described above may be generally implemented to ensure that stage motion, imaging, annealing, and electrical measurement may be safely and reliably performed. It is to be understood that in one or more embodiments, the above initialization protocol, as well as the various X-Y-Z stage 142 positions, are actively used in the operation and calibration of laser annealing system 100. In some embodiments, the laser focal plane may be engineered as an additional degree of freedom relative to the image focal plane, and the laser beam may be focused or defocused as desired.

In some embodiments, the prober unit 140 is housed or otherwise disposed within the optional environmental chamber 150 to control an ambient environment during laser annealing, wherein different ambient environments impact the laser annealing progression differently. For example, in some embodiments, the laser annealing system 100 may comprise an environmental gas control system which is coupled to the environmental chamber 150 and which is configured to inject a mixture of one or more gases into the environmental chamber 150 to control the annealing environment. More specifically, in some embodiments, the environmental gas control system may comprise a gas dilution unit which is connected to a plurality of gas cylinders which store different gases (e.g., nitrogen, dry air, etc.), wherein the gas dilution unit can mix different gases at various concentrations and inject the mixed gases into the environmental chamber 150, as desired, to provide a given gas environment for laser annealing. In addition, the environmental gas control system comprises a vacuum system coupled to the environmental chamber 150 to evacuate anneal gases from the chamber or otherwise evacuate air from the environmental chamber 150 to perform laser annealing in a vacuum atmosphere.

Moreover, in some embodiments, a temperature control system is coupled to the X-Y-Z stage 142 (e.g., wafer chuck) to control the temperature of the X-Y-Z stage 142 on which the quantum chip 160 is mounted. The X-Y-Z stage 142 may be temperature controlled to allow high-temperature anneals (e.g., bulk anneals) or low-temperature probing for low-noise electrical resistance measurements, as well as reducing the relative contribution of substrate conductivity on the junction resistance measurement. For example, in some embodiments, the X-Y-Z stage 142 can be temperature controlled in a range of −60° C. to 300° C.

As noted above, various functions of the laser unit 120, the microscope unit 130, and the prober unit 140 are automatically controlled by the control system 110. In some embodiments, the laser annealing control unit 111, the imaging control unit 112, and the prober control unit 113, comprise respective hardware interfaces for interfacing with the laser unit 120, the microscope unit 130, and the prober unit 140, as needed, to generate and apply control signals to components of such units 120, 130, and 140, and to receive and process signals (e.g., data, measurements, feedback controls signals, etc.) received from components of such units 120, 130, and 140. The data processing system 114 comprises one or more processors that execute software programs/routines to control laser annealing, imaging, and prober operations by processing data received from the control units 111, 112, and 113 (e.g., to perform automated pattern recognition for active alignments, perform junction resistance measurement computations, etc.), and generating and outputting control signals to cause the control units 111, 112, and 113, to control the operations of the laser unit 120, the microscope unit 130, and the prober unit 140 in a coordinated manner, when performing laser annealing and in-situ junction resistance measurements, as discussed herein.

For example, in some embodiments, the laser annealing control unit 111 is configured to control operation of components of the laser unit 120, such as the laser source 121 and the laser power control block 123, to adjust the power level of the laser beam output from the laser unit 120. In addition, the laser annealing control unit 111 is configured to control the operation of the components of the microscope unit 130 for laser annealing operations. For example, the laser annealing control unit 111 is configured to control the operation of the laser beam shutter 133 to control the duration of laser exposure when laser tuning a given Josephson junction. Further, in some embodiments, the laser annealing control unit 111 is configured to control the laser beam shaper 135, e.g., to switch the diffractive beam splitter settings and corresponding laser illumination patterns.

Further, in some embodiments, the imaging control unit 112 is configured to control the operation of the light source 131, the camera 132, and one or more of the optical components 136 (e.g., tube lens) that make up the image path of the microscope unit 130. For example, the imaging control unit 112 can generate camera control signals to cause the camera 132 to capture images within the FOV of the microscope unit 130 and send images to the imaging control unit 112. The imaging control unit 112 can be configured to preprocess the image data into a suitable format for processing by the data processing system 114 to perform automated pattern recognition functions to perform laser alignment and electrical probe alignment operations as discussed herein.

Moreover, in some embodiments, the prober control unit 113 is configured to control operations of the prober unit 140. For example, the prober control unit 113 comprises hardware for generating test voltages that are applied to the electrical probes for performing junction resistance measurements, e.g., for a 4-wire (Kelvin) resistance measurement, the prober control unit 113 may comprise current and voltage measurement circuitry, which is coupled to the electrical probes 144, and configured to measure current that flows through a Josephson junction as a result of applying a test voltage to the electrical probes, as well as measure a voltage across the Josephson junction. The measured currents and voltages can be digitized and sent to the data processing system 114 for computing junction resistances. In addition, the prober control unit 113 comprises control elements to precisely control movement and positioning of the X-Y-Z stage 142.

In some embodiments, the data processing system 114 executes a calibration process by performing laser annealing operations on Josephson junctions of representative hardware, using different combinations of laser anneal power and anneal time, to generate tuning calibration data (stored in the database of tuning calibration data 115). The tuning calibration data can be obtained by performing a calibration process on representative hardware which, in some embodiments, can be dummy Josephson junctions that reside on the same quantum chip to be tuned, and in other embodiments, can be Josephson junctions of qubits that are formed on a sister chiplet from the same fabrication process. The tuning calibration data is analyzed using statistical methods to fit the tuning calibration data to tuning curves, wherein the tuning curves are utilized to determine tuning rates and maximum tuning ranges for Josephson junctions under different laser anneal powers and anneal times. The tuning curves are utilized by the data processing system 114 to select a target combination of anneal power and annal time, as desired, for a target tuning rate and maximum tuning range for laser annealing Josephson junctions of the given quantum chip, post fabrication. In some embodiments, the tuning curves are used to predict an initial laser anneal operation (initial shot) for tuning a given Josephson junction to a certain target (e.g., 50% to target) on a first shot. The calibration process ensures a smooth and rapid approach to a target tuning for a given Josephson junction, while mitigating risk of both undershooting and overshooting the tuning.

In some exemplary embodiments, the control system 110 for the laser annealing system 100 may be implemented using any suitable computing system architecture which is configured to implement methods to support the automated control processes as described herein by executing computer readable program instructions that are embodied on a computer program product which includes a computer readable storage medium (or media) having such computer readable program instructions thereon for causing a processor to perform control methods as discussed herein. An exemplary architecture of a computing environment for implementing a control system that is configured to control the exemplary laser annealing apparatus for tuning Josephson junctions as disclosed herein, will be discussed in further detail below in conjunction with FIG. 10. It is to be appreciated that the exemplary laser annealing system 100 of FIG. 1 can be used to perform exemplary laser tuning methods, such as those discussed in detail below in conjunction with, e.g., FIGS. 2C, 5, 6, 7A, 7B, 7C, 7D, 8A, 8B, and 9, for tuning junction resistances of superconducting tunnel junction devices for various applications, e.g., tuning junction resistances of Josephson junctions of superconducting qubits whose transition frequencies can be tuned using LASIQ tuning operations that are based on the exemplary adaptive laser tuning techniques as discussed herein.

It is to be noted that in the exemplary laser annealing system 100 of FIG. 1, the laser unit 120 and the microscope unit 130 collectively comprise optical apparatus, and the prober unit 140 comprises an electrical characterization apparatus. The optical apparatus and electrical characterization apparatus comprise an integrated configuration of a laser annealing apparatus that is configured to perform various operations, in-situ, to facilitate laser tuning of junction resistances of superconducting tunnel junction devices on a quantum chip (e.g., Josephson junctions), wherein such operations include, for example, laser annealing operations for laser tuning junction resistances of superconducting tunnel junction devices on a quantum chip, and in-situ resistance measurements to measure the junction resistances of the superconducting tunnel junction devices at any time before, during, and/or after the laser annealing operations, as needed, to determine or otherwise track the progression of the junction resistance shifts of the superconducting tunnel junction devices.

In some embodiments, the electrical characterization apparatus is configured to perform direct current (DC) resistance measurement operations to measure the junction resistances of the superconducting tunnel junction devices. In some embodiments, the electrical characterization apparatus is configured to perform alternating current (AC) resistance measurement operations to measure the junction resistances of the superconducting tunnel junction devices.

In some embodiments, the resistance measurements are performed using 4-wire (Kelvin) resistance measurements for more precise measurements of junction resistances. In some embodiments, the electrical characterization apparatus comprises a wafer-scale prober apparatus (e.g., 200 millimeter (mm) or 300 mm wafer-scale prober apparatus) configured to perform the integrated electrical characterization techniques and discussed herein. The wafer prober comprises at least one of an automated and semi-automated wafer probing system.

Furthermore, in some embodiments, as noted above, the electrical characterization apparatus (e.g., prober unit 140) comprises an environmental chamber (e.g., chamber 150, FIG. 1) that is configured to control an ambient environment of the quantum chip when performing the laser annealing operations. For example, the environmental chamber is configured to control the ambient environment by at least one of (i) controlling a composition of one or more gases within the environmental chamber, and (ii) generating a vacuum within the environmental chamber, as desired, when performing, e.g., laser annealing operations. Exemplary techniques for ambient environment control will be discussed in further detail below in conjunction with FIG. 4.

Moreover, in some embodiments, the electrical characterization apparatus (e.g., prober unit 14) comprises a thermal control system that is configured to at least one of (i) heat a quantum chip to perform a bulk thermal anneal operation for shifting the junction resistances of superconducting tunnel junction devices of the quantum chip, and (ii) cool the quantum chip to perform the in-situ resistance measurements. Exemplary devices and techniques for implementing and utilizing thermal control will be discussed in further detail below in conjunction with, e.g., FIGS. 4, 8A, 8B, and 9.

It is to be noted that FIG. 1 illustrates an exemplary laser annealing apparatus in which the optical apparatus is implemented, in part, using a modular optical scope unit (e.g., the microscope unit 130), which comprises an optically integrated configuration of an imaging unit, optical components, a laser beam shaping device, and a laser beam focusing element. In particular, the microscope unit 130 comprises a modular optical scope unit with integrated components that are configured to generate, align, and project a desired laser beam pattern at the surface of the quantum chip to perform laser anneal operations. The microscope unit 130 is "modular" in that it provides an optical scope unit which comprises a packaged functional assembly of components to perform various functions (e.g., imaging, laser beam pattern generation and delivery, etc.), and which provides portability for use with suitable configurations of the laser unit 120 and the prober unit 140. The modular microscope unit 130 comprises a compact and portable optical scope assembly which can be mounted on a desired prober unit, and coupled to any suitable laser unit via a single mode optical fiber 125 to receive laser beam energy from a separate laser unit. In this regard, the modular microscope unit 130 does not include the actual laser source and, thus, can be made more compact and portable.

In this regard, on a fundamental level, the microscope unit 130 comprises a optical microscope device which comprises an optically integrated configuration of components for performing functions such as, e.g., imaging a target device within a field of view of the optical microscope device, laser annealing the target device by generating a laser beam spot pattern from a laser beam received on an optical fiber from a remote laser source, and controlling a duration of exposure of the laser beam spot pattern for laser annealing the target device. The optical microscope device comprises modular device which is configured for mounting to an electrical characterization system to enable in-situ electrical characterization of the target device in conjunction with laser annealing, wherein in some embodiments, the electrical characterization system comprises a wafer-scale prober unit.

Figure 2A:
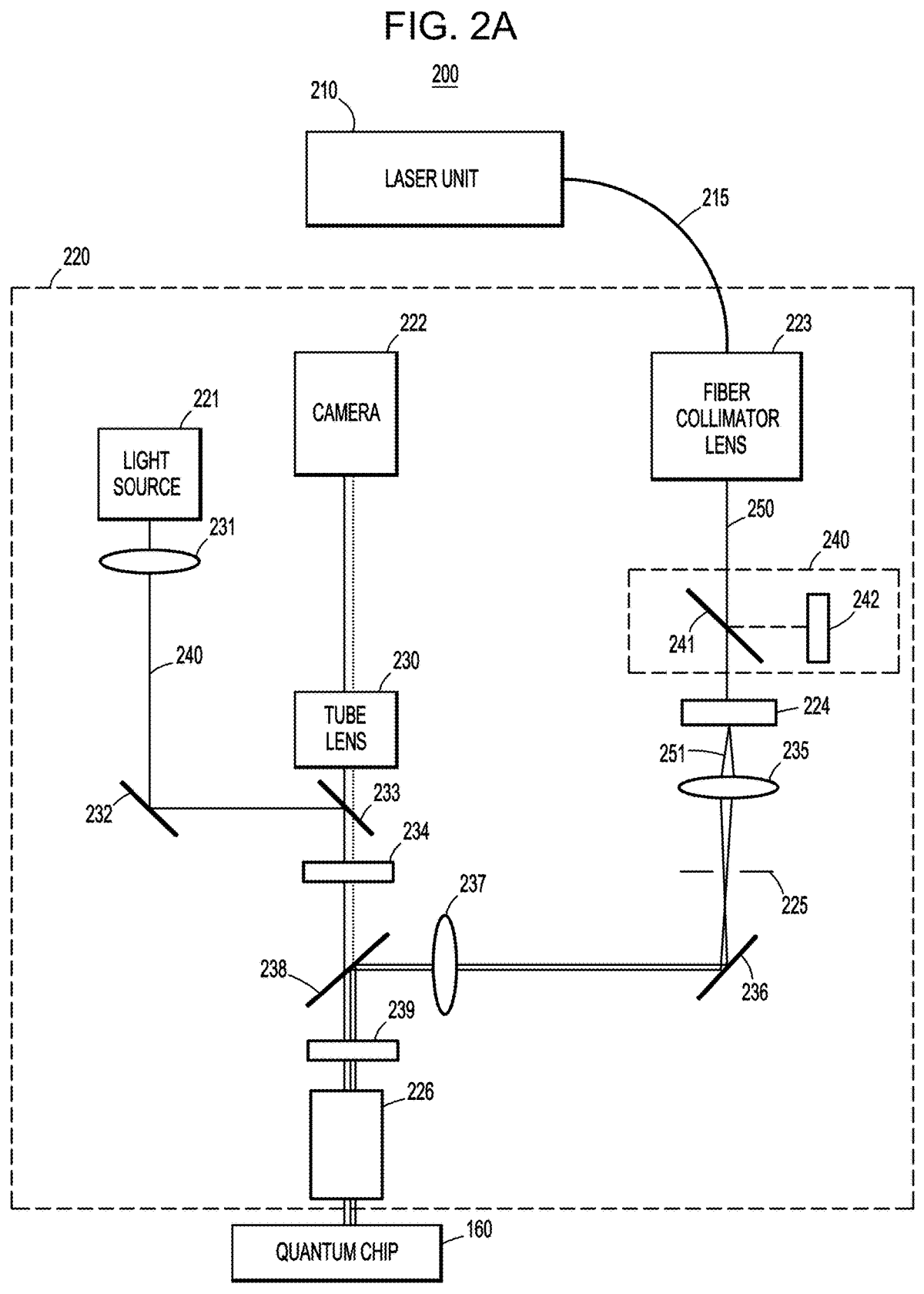

FIG. 2A schematically illustrates a laser annealing apparatus comprising a modular optical scope unit, according to an exemplary embodiment of the disclosure. In particular, FIG. 2A schematically illustrates a laser annealing apparatus comprising laser unit 210, optical fiber 215, and a modular optical scope unit 220. In some embodiments, the modular optical scope unit 220 schematically illustrates an exemplary architecture for implementing the microscope unit 130 of the laser annealing apparatus in FIG. 1. The modular optical scope unit 220 comprises a light source 221, a camera 222, a fiber collimator lens 223, a laser beam shaper 224, a laser beam shutter 225, and an objective lens 226, which perform the same or similar functions as the corresponding components of the microscope unit 130 as discussed above, the details of which will not be repeated.

Further, the modular optical scope unit 220 comprises a plurality of optical components such as a lens 231, a mirror 232, a beam splitter 233, a notch filter 234, a relay lens 235, a mirror 236, a relay lens 237, a beam splitter 238, and an optional quarter-wave plate 239, which are collectively configured for directing, reflecting, focusing, modifying, and shaping, etc., the optical signals (e.g., laser beams for annealing, and visible light/IR light for viewing) as needed for the given application. In general, the tube lens 230 comprises a multi-element optical component that is configured to focus parallel light coming through the objective lens 226 onto the image plane of the focal plane array of the camera 22. The notch filter 234 is configured to filter the light using known techniques. The beam splitters 233 and 238 are optical components that are configured to split incident light at a designated ratio into two separate beams, and combine two different beams into a single beam. The relay lenses 235 and 237 are configured to relay the laser beams along the optical laser path from the beam shaper element 224 to the objective lens 226. The optional quarter-wave plate 239 can be used to alter the polarization state of light traveling through the waveplate. For example, the optional quarter-wave plate 239 can be implemented to shift linearly polarized light into circularly polarized light, and vice versa.

In the light source path, the lens 231 is configured to "parallelize" the light emitted from the light source 221 to form an illumination beam 240. The illumination beam 240 is directed along an optical path by the mirror 232 to the beam splitter 233, through the notch filter 234, the beam splitter 238, the optional quarter-wave plate 239, and focused by the objective lens 236 to illuminate the portion of the quantum chip 260 within the FOV of the objective lens 226. The light source 221 together with the optical components 231, 232, and 233 implement a Kohler illumination configuration to create uniform illumination of the target features in the FOV of the objective lens 226, while ensuring that an image of the light source 221 is not visible in the resulting images captured by the camera 222.

In the laser beam path, the fiber collimator 223 collimates the laser light emitted from the optical fiber 215 to generate a collimated laser beam 250. In some embodiments, the modular optical scope unit 220 comprises a power monitor 240 which comprises, e.g., a beam sampler 241 (e.g., beam splitter) and a photodiode 242, to monitor the power of the collimated laser beam 250 to enable precise exposure control downstream from the power control/adjustment mechanisms provided by the laser unit 210. The collimated laser beam 250 propagates to the laser beam shaper 224 which, as noted above, is configured to split the collimated laser beam 250 into two or more laser beams with slightly different angles relative to one another. As noted above, the laser beam shaper 224 comprises a diffractive optical element, such as a diffractive beam splitter which splits a single laser beam into several beams (diffraction orders) in a predefined configuration.

Figure 2B:
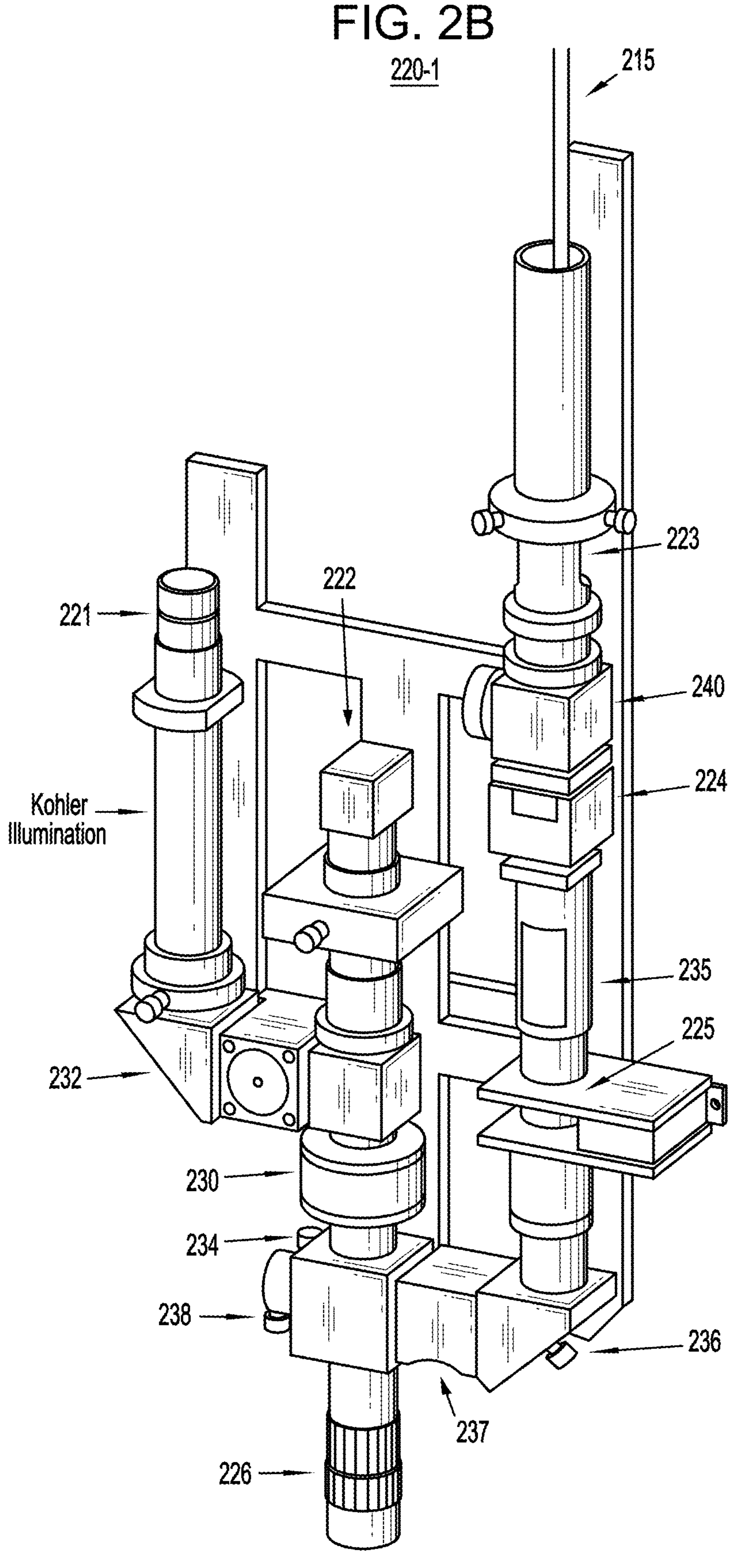
FIG. 2B is a perspective view of a modular optical scope unit, according to an exemplary embodiment of the disclosure.

FIG. 2B is a perspective view of a modular optical scope unit, according to an exemplary embodiment of the disclosure. In particular, FIG. 2B illustrates an exemplary modular optical scope unit 220-1, which is based on the exemplary integrated optical assembly architecture as schematically illustrated in FIG. 2A. The exemplary modular optical scope unit 220-1 shown in FIG. 2B comprises a portable, compact optical system that can be readily mounted on any suitable prober unit (e.g., wafer-level prober system) to integrate the optical and electrical characterization functionality of laser annealing apparatus to perform in-situ laser annealing and junction resistance measurement operations to facilitate laser tuning of superconducting tunnel junction devices on a quantum chip, e.g., perform a LASIQ process to tune transition frequencies of qubit devices in a given qubit lattice of the quantum chip 160.

Figure 2C:
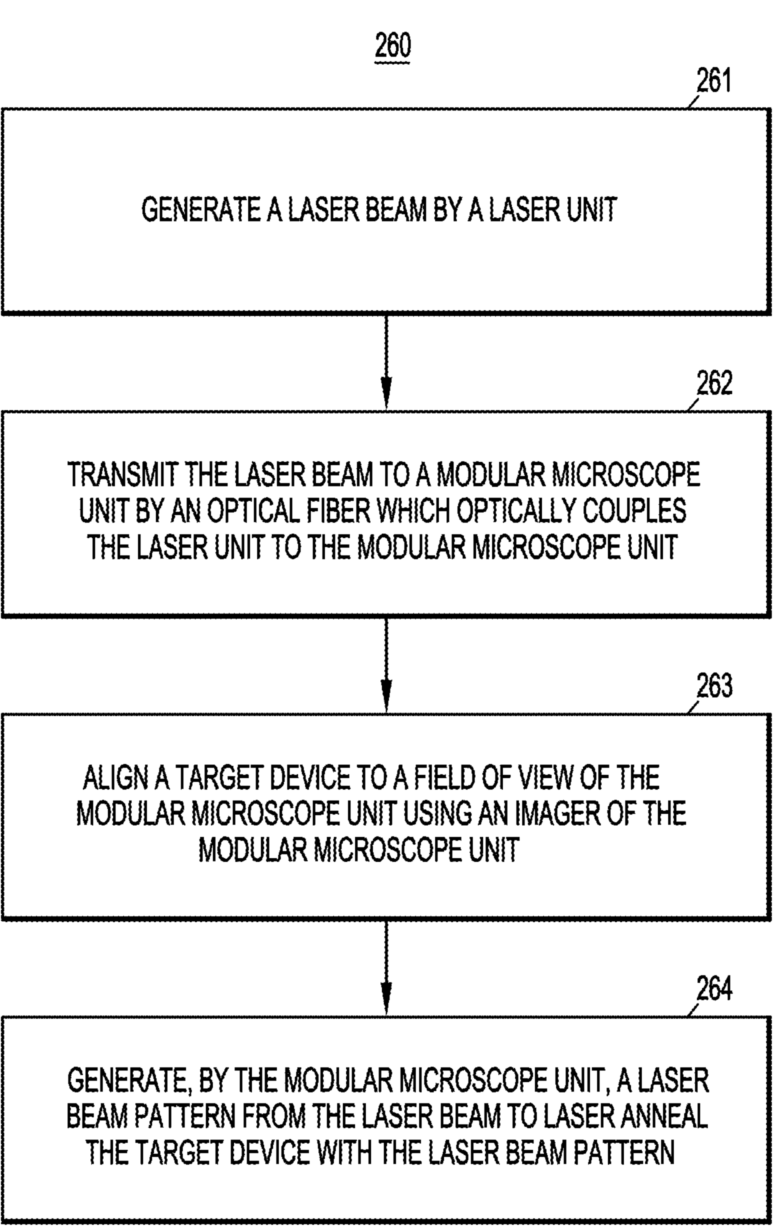
FIG. 2C illustrates a flow diagram of a method of performing a laser tuning operation using a laser annealing apparatus comprising a modular optical scope unit, according to an exemplary embodiment of the disclosure.

FIG. 2C illustrates a flow diagram of a method of performing a laser tuning operation using a laser annealing apparatus comprising a modular optical scope unit, according to an exemplary embodiment of the disclosure. In some embodiments, FIG. 2C illustrates operations that are performed by a laser annealing apparatus comprising a modular optical scope unit, e.g., the modular microscope unit 220 (FIG. 2A) to perform a laser tuning operation, according to an exemplary embodiment of the disclosure. FIG. 2C illustrates a high-level process 260 for performing a laser tuning operation. A laser beam is generated by a laser unit (block 261). The laser beam is transmitted to a modular microscope unit by an optical fiber which optically couples the laser unit to the modular microscope (block 262). A target device to be laser annealed (e.g., a Josephson junction of a qubit) is aligned to a FOV of the modular microscope unit using an imager of the modular microscope unit (block 263). More specifically, in some embodiments, as explained in further detail below, an alignment process comprises, e.g., imaging the FOV via the imager of the modular microscope unit to generate a sample image of the FOV, performing a pattern recognition process (via a control system) by comparing the sample image with a template image to determine an amount of offset between sample image and the template image, and causing the X-Y-Z stage to move the target device based on the determined offset to align the target device within the FOV of the modular microscope unit. The modular microscope unit generates a laser beam pattern from the laser beam (provided by the laser unit) to laser anneal the target device with the laser beam pattern (block 264).

It is to be noted that while FIGS. 1, 2A, and 2B illustrate exemplary embodiments of a laser annealing apparatus which comprises an integrated configuration of a modular optical scope and electrical characterization apparatus, in other embodiments, a laser annealing apparatus can be implemented using a discrete table-top optical apparatus in conjunction with an electrical characterization apparatus to perform laser tuning operations and associated operations as discussed herein. For example, FIG. 3A schematically illustrates a laser annealing system, according to another exemplary embodiment of the disclosure. In particular, FIG. 3A schematically illustrates a laser annealing system 300 which comprises a control system 310, an imaging unit 320, a laser unit 330, and prober unit 140 (e.g., electrical characterization apparatus). FIG. 3A illustrates an exemplary embodiment of an integrated configuration of a discrete table-top optical apparatus (e.g., implemented by the imaging unit 320 and laser unit 330) and an electrical characterization apparatus (e.g., implemented by the prober unit 140) to perform laser annealing operations discussed herein.

The laser unit 330 comprises a laser source to generate a laser beam, and various laser optical components which collectively operate to generate a laser beam pattern from the laser beam generated by the laser source, project the laser beam pattern onto a target sample to perform laser annealing operations, control annealing time using an electronic shutter, etc. The imaging unit 320 is a separate unit that is optically coupled to the laser unit 320. The imaging unit 320 is configured to support various operations such as real-time visualization, imaging, pattern recognition, and other related functions as discussed herein. The control system 310 is configured with suitable comprises hardware and software to control the operations of the imaging unit 320 and laser unit 330 using the same or similar control function and data processing functions as the control system 110 of FIG. 1, the details of which will not be repeated. The imaging unit 320 and laser unit 320 can be implemented using any suitable architecture, such as shown in FIG. 3B.

Figure 3B:
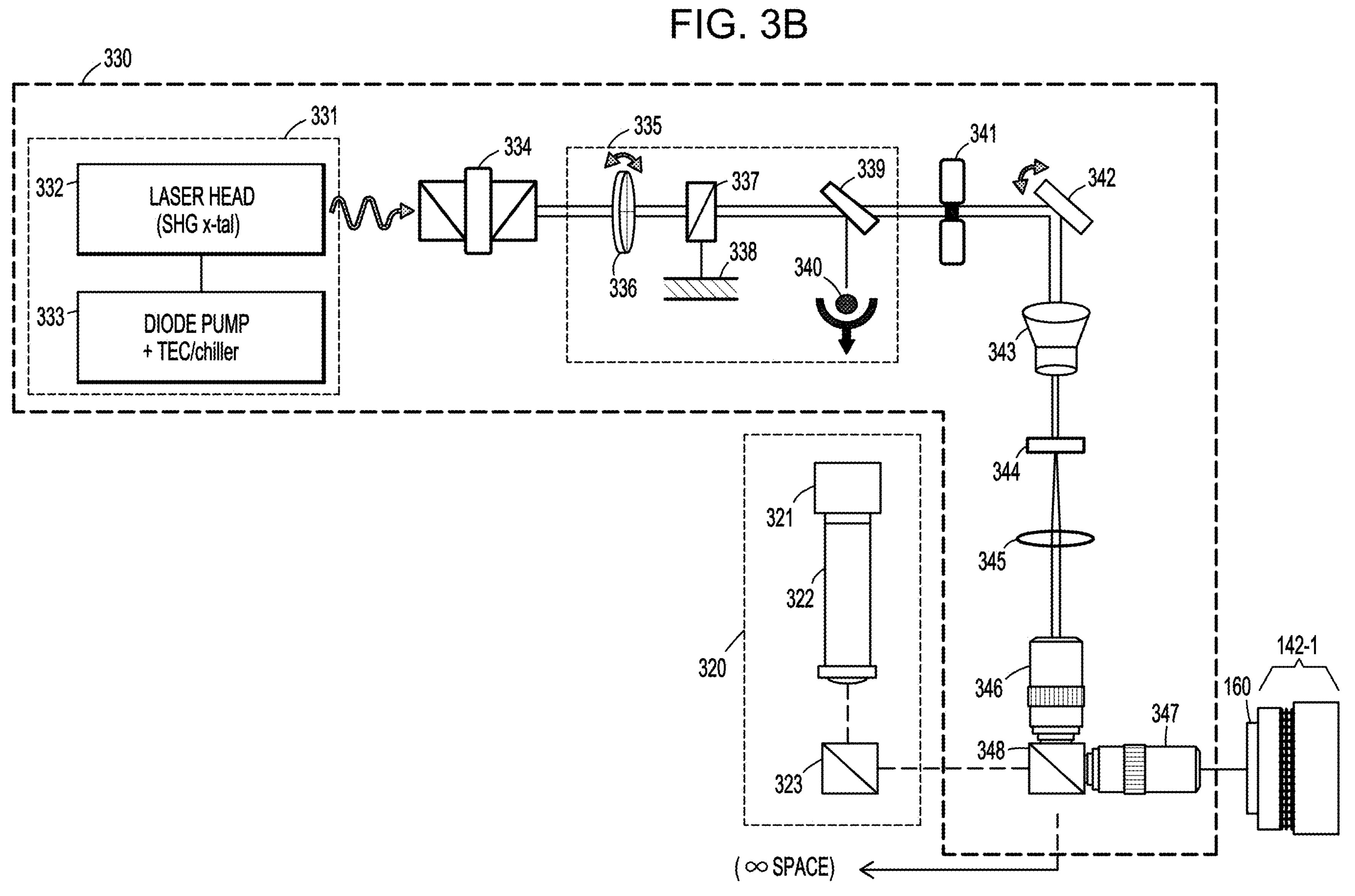
FIG. 3B schematically illustrates an optical system which can be implemented in the laser annealing system of FIG. 3A, according to an exemplary embodiment of the disclosure.

FIG. 3B schematically illustrates an optical system which can be implemented in the laser annealing system of FIG. 3A, according to an exemplary embodiment of the disclosure. In particular, FIG. 3B schematically illustrates an imaging unit 320, a laser unit 330, and an X-Y-Z stage 142-1 for mounting quantum chip 160 to be laser annealed. In general, the imaging unit 320 comprises a camera 321, a tub lens 322, and abeam splitter 232. The laser unit 330 comprises a laser source 331 which comprises a laser head 332, and diode pump 333 to generate laser energy, wherein the diode pump 333 is cooled using any suitable thermoelectric cooling device. The laser unit 330 further comprises an isolator 334, a laser power monitor and control block 335 (which comprises a half-wavelength waveplate 336, a polarizing beam splitter 337, a dump 338, an optical wedge 339, and photodiode 340), an electronic shutter 341, a piezo-mirror mount 342, a beam reducer 343, a diffraction grating 344 (to generate a laser beam pattern), a focus lens 345, a first objective lens 346 and a second objective lens (providing a double objective lens system), and a polarizing beam splitter 348. The imaging unit 320 and laser unit 330 are optically coupled via the beam splitter 323 and the polarizing beam splitter 348.

The various components of the imaging unit 320 and laser unit 330 operate in the same or similar manner as discussed above in conjunction with FIG. 1. To briefly reiterate, in some embodiments, the laser source 33 comprises a 532 nm (frequency doubled) diode-pumped solid-state laser to generate a laser beam that is utilized as a laser annealing source. The laser power monitor and control block 335 actively calibrates the laser beam power via the combination of the half-wave plate 336 and the polarizing beam splitter 337. The optical window wedge 339 is used as a laser power pick-off onto the silicon photodiode 340 to monitor the laser power level to set the appropriate laser power level for a laser anneal operation. The piezo mirror mount 342 actively aligns the laser beam within the FOV of the object lens (via image pattern recognition), and the laser beam is optionally shaped by the diffraction grating 344 (e.g., a holographic diffraction grating) to create a multi-spot beam pattern. The beam size is condensed 4× using a the dual-objective setup, which also provides 20× junction image magnification. The magnified image of the quantum chip 160 is imaged by the camera 321 and used for active alignment of a target device (e.g., Josephson junction of a qubit).

Figure 4:
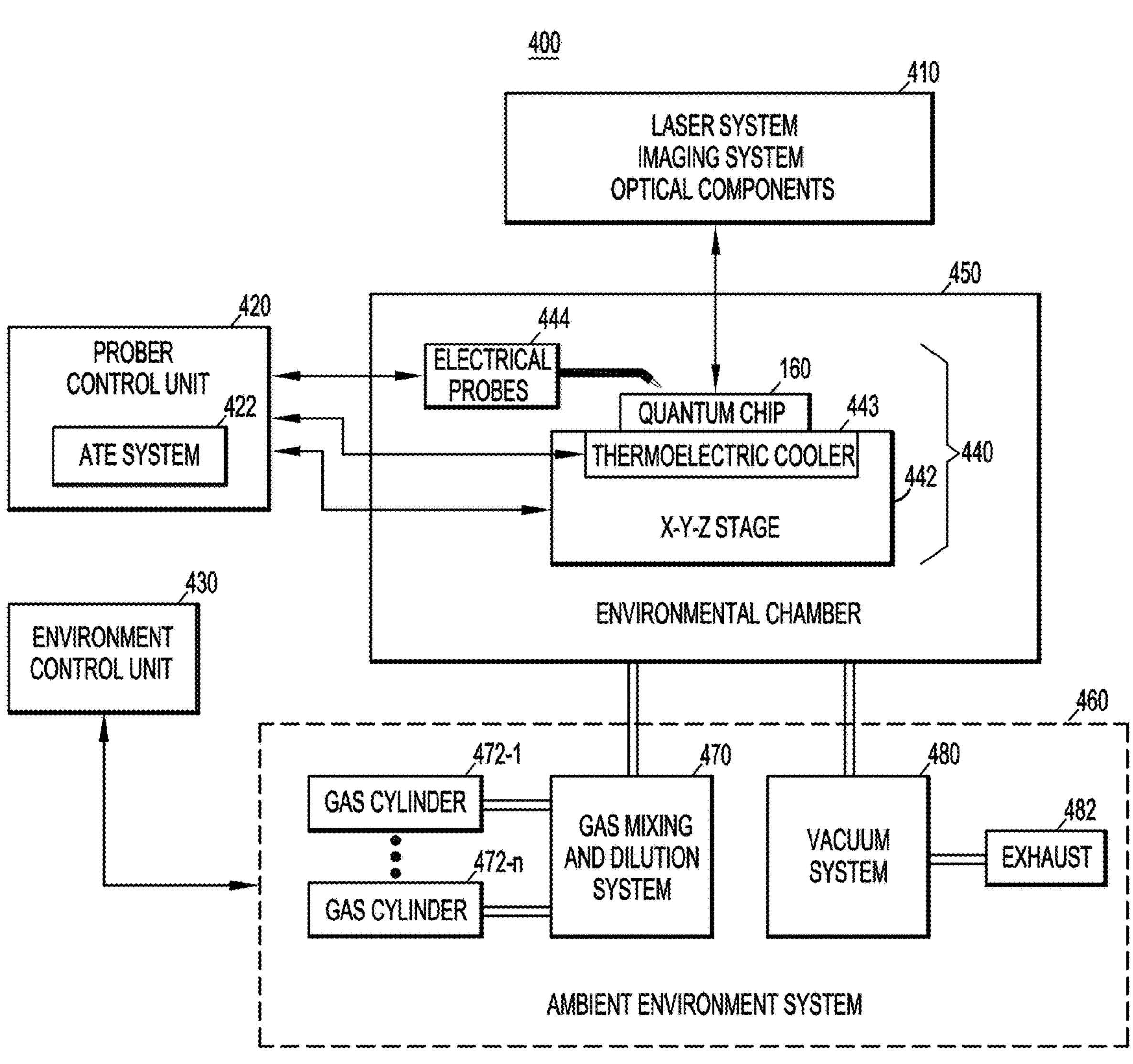
FIG. 4 schematically illustrates a laser annealing system, according to another exemplary embodiment of the disclosure.

FIG. 4 schematically illustrates a laser annealing system, according to another exemplary embodiment of the disclosure. In particular, FIG. 4 schematically illustrates a laser annealing system 400 which comprises an optical system 410, a prober control unit 420, an electrical characterization system 440 (e.g., prober unit) disposed in an environmental microchamber 450, an environment control unit 430, and an ambient environment system 460. The optical system 410 comprises a laser system, imaging system and associated optical components. The optical system 410 can be implemented using any one of the exemplary optical architectures of the laser units, imaging units, and modular microscope units, as discussed above in conjunction with FIGS. 1, 2A, 2B, 3A and 3B.

The electrical characterization system 440 (e.g., prober unit) comprises an X-Y-Z stage 442 having a wafer chuck which comprises a thermoelectric cooler 443, and electrical probes 444. The electrical characterization system is similar in configuration and operation of the prober unit 140 discussed above in conjunction with FIG. 1, except that the exemplary electrical characterization system 440 implements the thermoelectric cooler 443 to provide a thermal control system (e.g., temperature-controlled wafer chuck system, or other suitable types of heating/cooling systems) that is configured to (i) heat the quantum chip 160 to perform a bulk thermal anneal operation for shifting the junction resistances of the tunnel junction devices of the quantum chip 160, and (ii) cool the quantum chip 160 to perform the in-situ resistance measurements, as will be discussed in further detail below. In some embodiments, a temperature-controlled wafer chuck system can be temperature controlled in a range of −60° C. to 300° C. The prober control unit 420 comprises or otherwise implements an automated test equipment (ATE) system 422 which comprises a combination of hardware and software to control automated operations of the electrical characterization system 400 (e.g., automated movement of probes, generating test signals, processing resulting voltage/current signals generated as a result of resistance measurement probing operations, etc.)

The electrical characterization system 440 is housed or otherwise disposed within the environmental chamber 450 to control an ambient environment within the environmental chamber 450 by operation of the environment control unit 430 and the ambient environment system 460. The ambient environment system 460 comprises a gas mixing and dilution system 470, which comprises an environmental gas control system which is coupled to the environmental chamber 450 and which is configured to inject a mixture of one or more gases into the environmental chamber 450 to control the annealing environment. The gas mixing and dilution system 470 is connected to a plurality of gas cylinders 472-1, . . . , **472-*n*, which store different gases (e.g., nitrogen, dry air, etc.). The gas mixing and dilution system 470 operates under control of the environment control unit 430 to mix different gases at various concentrations and inject the mixed gases into the environmental chamber 450, as desired, to provide a given gas environment for laser annealing. In addition, the ambient environment system 460 comprises a vacuum system 480 coupled to the environmental chamber 450 to evacuate anneal gases from the chamber 450 or otherwise evacuate air from the environmental chamber 550 to perform laser annealing in a vacuum atmosphere. An exhaust system 482 is coupled to the vacuum system 480**, wherein the exhaust system is configured to direct the evacuated gases for proper disposal.

Figure 5:
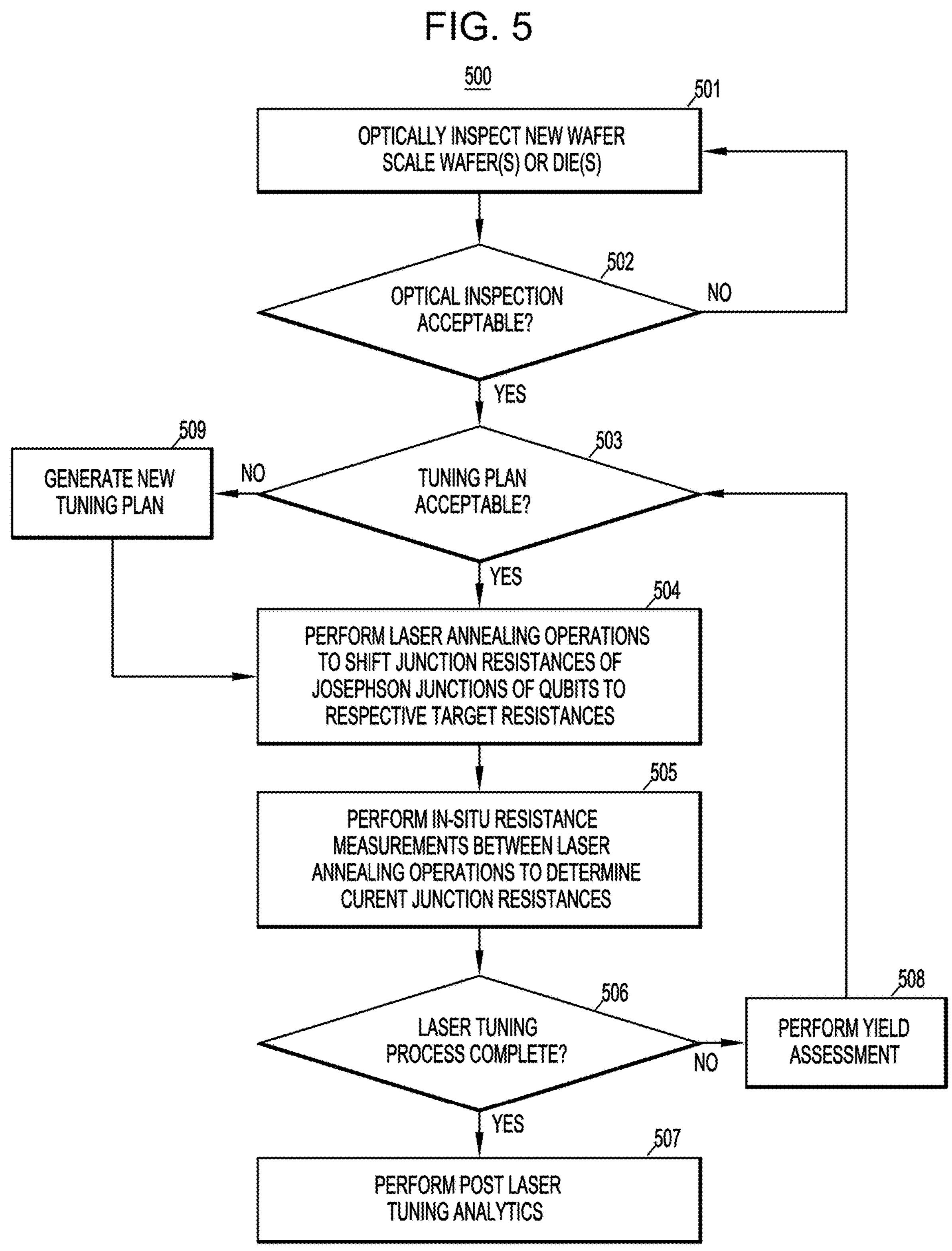
FIG. 5 illustrates a flow diagram of a method for tuning Josephson junctions of quantum bit devices of a qubit lattice based on a tuning plan, according to an exemplary embodiment of the disclosure.

FIG. 5 illustrates a flow diagram of a method for tuning Josephson junctions of qubit devices of a qubit lattice based on a tuning plan, according to an exemplary embodiment of the disclosure. In particular, FIG. illustrates a process 500 which comprises various operations that can be performed using the exemplary laser annealing systems and apparatus as disclosed herein to perform in-situ junction resistance measurement and laser annealing operations on Josephson junctions of superconducting qubits to tune the junction resistances of the Josephson junctions to respective target junction resistances and thereby tune the transition frequencies of the superconducting qubits of a given qubit lattice (via a LASIQ tuning process), based on a frequency tuning plan that is generated and updated to eliminate or otherwise minimize the potential for frequency collisions in the give qubit lattice.

Referring to FIG. 5 the process 500 comprises an initial step of placing a quantum device (e.g., quantum chip or quantum wafer) on the X-Y-Z stage of the electrical characterization system (e.g., probe unit) and optically inspecting the quantum device using the optical system (e.g., modular microscope unit) for physical defects or damage (block 501). In an exemplary embodiment, the quantum device comprises a lattice of superconducting qubits that are to be laser tuned, post fabrication, to trim the transition frequencies of the superconducting quits according to an initial frequency tuning plan generated for the lattice of superconducting qubits. If the optical inspection is deemed acceptable (affirmative determination in block 502), the process 500 proceeds to obtain an initially generated frequency tuning plan which is assumed at this point to be acceptable (affirmative determination in block 503).

The process 500 proceeds to perform laser annealing operations on the Josephson junctions of the superconducting qubits to shift junction resistances of respective Josephson junctions to respective target junction resistances (block 504). The target junction resistance ($R_{target}$) for a given Josephson junction of a superconducting qubit is specified in the tuning plan, wherein the target junction resistance of the given Josephson junction corresponds to a target transition frequency of the associated superconducting qubit. The process 500 performs in-situ resistance measurements between laser annealing operations to determine the current junction resistances of the Josephson junctions (block 505) as the junction resistances of the Josephson junctions are progressively shifted toward their respective target junction resistances by performing iterative annealing operations.

After performing one or more iterations of a laser annealing process, a determination is made as to whether the laser tuning is complete (block 506). The laser tuning process will be deemed incomplete (negative determination in block 506) if the in-situ resistance measurements indicate that some or all of the Josephson junctions are not at their respective target junction resistance. In some embodiments, a yield assessment is performed (block 506) to, e.g., determine how many frequency collisions are expected based on the current junction resistances of the Josephson junctions (and thus the corresponding current transition frequencies of the superconducting qubits) based on the given frequency tuning plan. Based on the results of the yield assessment, if it is determined that the current tuning plan is not acceptable (negative determination in block 503), a new updated tuning plan is generated (block 509). For example, the current tuning plan may be deemed unacceptable if the yield assessment indicates that at least some of the target transition frequencies as specified in the current tuning plan are not achievable based at least in part on the currently measured junction resistances of the Josephson junctions. The laser tuning operations then proceed (return to block 504) based on the newly updated tuning plan. When the laser tuning process is deemed complete (affirmative determination in block 506), the process 500 can proceed to perform post laser tuning analytics (block 507).

In some embodiments, the exemplary laser tuning methods as discussed herein comprise iterative laser tuning methods for tuning junction resistances of superconducting tunnel junction devices (e.g., Josephson junctions) by implementing asymptotic tuning methodologies in which Josephson junctions of, e.g., qubits on a given multi-qubit device are adaptively and progressively tuned in an incremental manner to progressively shift junction resistances towards respective target junction resistances of the Josephson junctions. In some embodiments, as explained in further detail below in conjunction with FIG. 6, an adaptive and progressive tuning of a given Josephson junction is implemented by adaptively determining the anneal time for a given tuning iteration at a given laser power level based on a function of (i) an amount of resistance shift remaining to reach the target junction resistance and (ii) a total amount of anneal time spent for previous laser anneal iterations applied to the superconducting tunnel junction. Such iterative tuning methods are contrasted with conventional tuning method in which Josephson junctions are tuned to a target junction resistance using a single laser shot, or single anneal iteration, which is unpredictable.

Furthermore, in some embodiments, the exemplary laser tuning methods are configured to determine a target combination of laser power level and anneal time for a given Josephson junction to perform an initial laser anneal operation (initial shot) on the given Josephson junction to achieve an initial junction resistance shift which reaches an initial target resistance ($R_{initial\_target}$) that corresponds to, e.g., about a 50% resistance shift to a specified target junction resistance $R_{target}$. In particular, the initial shot is configured to achieve an initial resistance shift $\Delta R_{initial}$–$R_{initial\_target}$–$R_{initial}$, where $$\Delta R_{initial}\ \% = \frac{R_{target} - R_{initial\_target}}{\Delta R_{target}} \times 100\%,$$

where $\Delta R_{target}=R_{target}-R_{initial}$. In an exemplary embodiment, the initial laser annealing operation (initial shot) for a given Josephson junction is performed at a determined combination of laser power level and anneal time to achieve a $\Delta R_{initial}$ % of about 50%, or any other desired percentage, depending on the application.

In some embodiments, as noted above, the tuning calibration data 115, FIG. 1 is utilized to determine a target combination of laser power level and laser anneal time to utilize for the initial shot of a given Josephson junction. The tuning calibration data 115 comprises information such as, e.g., a maximum tuning range that can be achieve for each of a plurality of different combinations of laser power and anneal time, and tuning curves that represent tuning rates for the different combinations of laser power and anneal time. In some embodiments, the calibration data is obtained by performing a calibration process which generally comprises (i) performing laser annealing operations on a set of test Josephson junctions using different combinations of laser power and anneal time, (ii) determining junction resistance shifts of the test Josephson junctions as a result of the laser annealing operations, and (iii) utilizing the determined junction resistance shifts of the test Josephson junctions to determine calibration data for configuring laser annealing operations for laser tuning Josephson junctions corresponding to the test Josephson junctions. In some embodiments, the set of test Josephson junctions reside on a test quantum chip (e.g., sister chiplet) having the test Josephson junctions which are fabricated using fabrication processes that are the same fabrication processes used to fabricate the Josephson junctions that are to be laser tuned by laser annealing operations configured using the calibration data. In other embodiments, set of test Josephson junctions reside (e.g., in kerf regions) on the same quantum chip as the Josephson junctions that are to be laser tuned by laser annealing operations configured using the calibration data.

FIG. 6 illustrates a flow diagram of a method for tuning Josephson junctions, according to an exemplary embodiment of the disclosure. In some embodiments, FIG. 6 illustrates a control process for iteratively and adaptively tuning the Josephson junctions of qubits on a quantum chip, which can be performed using any of the exemplary laser annealing systems as discussed herein (e.g., laser annealing system 100 of FIG. 1). FIG. 6 illustrates an exemplary embodiment of an iterative tuning process in a round-robin format, whereby each round-robin involves iterating through all Josephson junctions, each of which is measured and "shot" one time to achieve an incremental junction resistance shift, such that each successive iteration is performed on a different Josephson junction on the quantum chip. FIG. 6 further illustrates an exemplary embodiment of a tuning process wherein before each in-situ junction resistance measurement, a probe contact resistance check and probe contact stability check are performed to ensure sufficient contact between the electrical probes and the contact pads of the Josephson junction being tested.

Referring to FIG. 6, a quantum chip is placed on the X-Y-Z stage 142 of the prober unit 140, and the control system 110 commences an automated tuning process (block 600). The automated tuning process selects an initial Josephson junction of a qubit and moves to the selected Josephson junction (block 601). In particular, the control system 110 moves the X-Y-Z stage 142 to place the initial Josephson junction into the FOV of the microscope unit 130. The tuning process initiates control operations to cause the microscope unit and the probe unit to perform a focus and alignment process to ensure a proper focus to the focal plane and proper alignment of the target Josephson junction within the FOV of the microscope unit 130 for the purpose of performing an in-situ Josephson junction resistance measurement (block 602). An exemplary focusing process will be described below in conjunction with FIG. 7A. The focus ensures that the sample plane (e.g., the plane which contains the target Josephson junction) is at the focal plane (i.e., plane of focus) of the objective lens 137. The focus can be adjusted by adjusting the Z position of the X-Y-Z stage 142. As noted above, the alignment to the Josephson junction is performed using a machine learning pattern recognition process to align the Josephson junction to the center of the FOV. In addition, depending on the given iteration, the alignment can be slightly adjusted in the X and/or Y position to ensure that the electrical probes of the prober unit land on a different location of the contact pads of the Josephson junction, and not on the same location for each tuning iteration of the Josephson junction.

Next, the tuning process proceeds by causing the prober unit to move the contact pads of the Josephson junction in contact with the electrical probes, and perform contact resistance and contact stability checks (block 603). An exemplary process for checking contact resistance and contact stability will be described below in conjunction with FIG. 7B. After completion of successful contact resistance and contact stability tests, an in-situ junction resistance measurement is performed to determine the current junction resistance of the Josephson junction (block 604) using the same or similar resistance measurement methods as discussed herein (e.g., Kelvin resistance measurement).

The tuning process determines whether the measured junction resistance $R_{current}$ of the given Josephson junction is at or near a target junction resistance $R_{target}$ for the given Josephson junction (block 605). For example, as noted above, a determination is made as to whether the currently measured junction resistance $R_{current}$ is within a specified threshold percentage of the target junction resistance $R_{target}$, i.e., $$\frac{|R_{target} - R_{current}|}{R_{target}} \leq x(\text{e.g., } x = 0.003).$$

If it is determined that the measured junction resistance $R_{current}$ of the given Josephson junction is not at (or near) the target junction resistance $R_{target}$ for the given Josephson junction (negative determination in block 605), the tuning process prepares for a laser anneal operation.

For example, the tuning process initiates control operations to cause the microscope unit 130 and the prober unit 140 to perform a focus and alignment process to ensure a proper focus to the focal plane and proper alignment of the target Josephson junction within the FOV of the microscope unit 130 for the purpose of performing the laser anneal operation (block 606). An exemplary focus and alignment process to prepare for a laser anneal operation will be discussed in further detail below in conjunction with FIG. 7C. In addition, the tuning process proceeds to determine the "shot" anneal time and laser power to utilize for laser annealing the given Josephson junction for the given iteration, based on the measured junction resistance (block 607). This process is performed using the same or similar methods as discussed above in conjunction with FIGS. 2, 3A, and 3B, the details of which need not be repeated.

The laser anneal operation (shot) for the given iteration is performed using the determined anneal time and laser power to laser anneal the given Josephson junction (block 608). After completion of the last anneal operation, the tuning process proceeds to the next Josephson junction to be tuned (block 601), and the process is repeated. When, at a given point in the iterative process it is determined that the currently selected Josephson junction is at its respective target resistance (affirmative determination in block 605), and that there are no remaining Josephson junctions to be further tuned (negative determination in block 609), the tuning process is terminated (block 610). In this instance, it is assumed that each Josephson junction is tuned to its respective target junction resistance and, consequently, each corresponding qubit has been tuned to its respective target transition frequency.

As noted above, FIG. 6 illustrates an adaptive tuning process which comprises an iterative laser tuning process for tuning the junction resistances of the Josephson junctions by implementing an asymptotic tuning methodology in which Josephson junctions of, e.g., qubits on a given multi-qubit device are adaptively and progressively tuned in an incremental manner to progressively shift junction resistances towards respective target junction resistances of the Josephson junctions. In some embodiments, adaptive and progressive tuning of a given Josephson junction is implemented by adaptively determining the anneal time ($t_{shot}$) for a given tuning iteration at a given laser power level based on a function of (i) an amount of resistance shift remaining (denoted $\Delta R_{remaining}$) to reach the target junction resistance, and (ii) a total amount of anneal time spent for previous laser anneal iterations applied to the superconducting tunnel.

For example, an exemplary function for determining an anneal time ($t_{shot}$) for a given "shot" at a given laser power level is expressed as:

$$t_{shot}(N_A) = \frac{\Delta R_{target} - \Delta R}{\Delta R_{target}} \cdot \sum_{i=1}^{N_A - 1} t_{shot}(i) \text{ for } [N_A > 1],$$

where $N_A$ denotes an anneal number (or "shot" number), where $\Delta R_{target}$ denotes a difference between a target junction resistance ($R_{target}$) of a given Josephson junction and an initial measured resistance (denoted $R_{initial}$) of the given Josephson junction before the initial anneal operation (at $N_A=0$), and where $\Delta R$ denotes a difference between $R_{initial}$ and a currently measured junction resistance (denoted $R_{current}$) of the given Josephson junction, which is measured in a given iteration before applying the next "shot" based on the computed anneal time $t_{shot}$ for the given iteration. In other words, $\Delta R_{target}=R_{target}-R_{initial}$, $\Delta R=R_{current}-R_{initial}$, and $\Delta R_{remaining}=R_{target}-R_{current}$. In the context of an adaptive tuning process, the parameter $R_{current}$ denotes a current junction resistance that is measured at the beginning of each successive iteration of the adaptive tuning process, and the computation $t_{shot}$ is performed for each successive iteration of the adaptive tuning process to determine a target anneal time for performing the laser anneal operation for given iteration. In some embodiments, the laser power level that is used in each iteration is the laser power level that was initially selected to perform the initial laser annealing operation (initial shot).

In the exemplary function for computing $t_{shot}$, the ratio $$\frac{\Delta R_{target} - \Delta R}{\Delta R_{target}} = \frac{\Delta R_{remaining}}{\Delta R_{target}}$$

provides a weight factor that represents a percentage of the amount of a remaining amount of resistance shift needed to reach the target junction resistance $R_{target}$ of the given Josephson junction based on the total resistance shift needed to reach the target junction resistance $R_{target}$ starting from the initial measured junction resistance $R_{initial}$ of the given Josephson junction. In addition, the summation $$\sum_{i=1}^{N_A - 1} t_{shot}(i)$$

provides weight factor based on the sum total time of all anneal times (total amount of all determined $t_{shot}$ times) of all previous "shots" applied to the given Josephson junction. It is to be noted that the exemplary function for $t_{shot}$ provides a linear combination of weight factors based on a product of $\Delta R_{remaining}$ and the total historical anneal time. In other embodiments, a function for computing $t_{shot}$ can be based on other parameters and/or based on a non-linear function of the parameters $\Delta R_{remaining}$ and the total historical anneal time and/or other parameters, depending on, e.g., the application and/or the tuning characteristics of the Josephson junction as determined based on the associated tuning calibration data obtained using the calibration techniques as discussed herein.

Based the exemplary parameters of the function $t_{shot}$, at a given iteration of the tuning process, if the measured junction resistance indicates that there is a relatively large amount of resistance shift still needed to reach the target junction resistance $R_{target}$, the determined anneal time, $t_{shot}$, will be weighted (by the $$\text{ratio } \frac{\Delta R_{remaining}}{\Delta R_{target}}\bigg)$$

to be longer. On the other hand, if there is a relatively small amount of resistance shift needed to reach the target junction resistance $R_{target}$, the anneal time, $t_{shot}$, will be weighted (by the $$\text{ratio } \frac{\Delta R_{remaining}}{\Delta R_{target}}\bigg)$$

to be shorter. As another example, if the summation $$\sum_{i=1}^{N_A-1} t_{shot}(i)$$

at a given iteration (e.g., at a given $N_A$) of the tuning process indicates a relatively large total amount of annealing has been performed on the given Josephson junction, this provides an indication that the given Josephson junction is tuning slowly, so that the next anneal time, $t_{shot}$, will be weighted (by the sum total anneal time) to be relatively long. On the other hand, if the summation $$\sum_{i=1}^{N_A-1} t_{shot}(i)$$

at a given iteration of the tuning process indicates a relatively small total duration of annealing has been performed on the given Josephson junction, this provides an indication that the given Josephson junction is tuning relatively fast, so that the next anneal time, $t_{shot}$, will be weighted (by the sum total anneal time) to be relatively short.

The exemplary laser tuning methods as discussed herein are contrasted with conventional tuning method in which Josephson junctions are tuned to a target junction resistance using a single laser shot, which is unpredictable. The exemplary junction tuning techniques as disclosed herein are configured to perform an initial "shot" on a given Josephson junction to shift the junction resistance from the initial resistance ($R_{initial}$) to a junction resistance that is, e.g., about 50% to the target junction resistance ($R_{target}$), following by iteratively tuning the junction resistance of the given Josephson junction using multiple shots with anneal times that are adaptively determined for each shot to ensure a gradual approach to a target junction resistance, while accounting for relaxation of the junction resistances after laser annealing, which may require a period of time delay to settle closer to their final values. In an exemplary embodiment of a laser tuning progression after the first shot, the junctions (starting from the first, and progressing to the last) are each shot once in succession, and the process repeats starting at the first junction again. In this manner, the first junction resistance has time to relax and stabilize close to its final value prior to the subsequent shots. In another embodiment of a laser tuning progression after the first shot, each junction may be iteratively annealed to completion prior to annealing the next junction. In this case, a time delay may be implemented in between successive anneal iterations on the same junction, to allow the junction resistances to relax and stabilize near their final values to improve the accuracy of approaching resistance targets.

FIG. 7A illustrates a flow diagram of a method for focusing and aligning to a target Josephson junction for the purpose of performing an in-situ Josephson junction resistance measurement, according to an exemplary embodiment of the disclosure. In some embodiments, FIG. 7A illustrates an exemplary process 700 for implementing the focus/alignment processes in block 402 of FIG. 6. An initial step of the process 700 involves performing a coarse alignment in which the X-Y-Z stage 142 is controllable operated to move the target Josephson junction in alignment to a center of the FOV of the microscope unit (block 701). The prober unit 140 is then controlled to sweep the Z position of the X-Y-Z stage 142 through a series of discrete steps (positions), and the camera 132 of the microscope unit 130 is controlled to capture and save a digital image of the sample (sample image) in the FOV at each Z position (block 702).

The tuning process then determines a sharpest sample image among the plurality of sample images taken at the different Z positions (block 703). In some embodiments, the sharpest sample image is determined using, e.g., an edge detection process to identify the sample image with the sharpest edges (e.g., sharpest edges of contact pads to which the electrical probes will make contact). The X-Y-Z stage 142 is then controlled to move to the target Z position corresponding to the sharpest sample image (block 704), wherein it is assumed that at the target Z position, the sample imaging plane with the contact pads is displaced from the probing plane at a known distance (e.g., 70 microns). Finally, an optional step of slightly adjusting the X and/or Y position of the quantum chip can be performed to provide some small offset from the original center alignment (block 705), which allows the probe tips of the electrical probes to make contact to the contact pads of the given Josephson junction in desired target contact positions which are different from the contact positions made to the contact pads for previous in situ junction resistance measurements of previous iterations.

FIG. 7B illustrates a flow diagram of a method for performing contact resistance and contact stability check operations prior to performing an in-situ Josephson junction resistance measurement, according to an exemplary embodiment of the disclosure. In some embodiments, FIG. 7B illustrates an exemplary process 710 for implementing the contact resistance and stability check processes in block 603 of FIG. 6. An initial step of the process 710 involves making contact between the tips of the electrical probes and the contact pads of the Josephson junction (block 711) using the same or similar methods as discussed herein.

Next, the process proceeds to measure the contact resistance between the electrical probes and the contact pads of the Josephson junction (block 712). The contact resistance is measured using known techniques. A determination is made as to whether the measured contact resistance is less than a contact resistance threshold (block 713). If the measured contact resistance is determined to be less than the contact resistance threshold (affirmative determination in block 713), the tuning process proceeds to determine whether the contact is stable (block 714). In some embodiments, a contact stability check is performed by repeatedly measuring the contact resistance over a given period of time (e.g., 1-10 seconds) and determining whether the contact resistance as repeatedly measured over the given period remains less than the contact resistance threshold. The contact stability check is performed to ensure that the electrical contacts between the electrical probe tips and the contact pads of the Josephson junction are stable, because intermediate or intermittent contact during an in-situ junction resistance measurement operation can cause voltage spikes and potentially damage the Josephson junction being measured.

In response to determining that the electrical contacts between the probes and the contact pads have low contact resistance and are stable (affirmative determinations in blocks 713 and 714), the tuning process proceeds to perform the in-situ junction resistance measurement operation to measure the resistance of the Josephson junction (block 715). On the other hand, if either the contact resistance check or the contact stability check fails (negative determination in block 713 or block 714), the tuning process can skip the junction resistance measurement for that Josephson junction, and move to a next Josephson junction and proceed with the round-robin tuning iteration for the next Josephson junction (block 716). In this instance, remedial actions can be taken (e.g., cleaning probe tips, or making contact to different areas on the contact pads of the skipped Josephson junction) to ensure that the skipped Josephson junction can be tuned in a subsequent iteration.

Figure 7C:
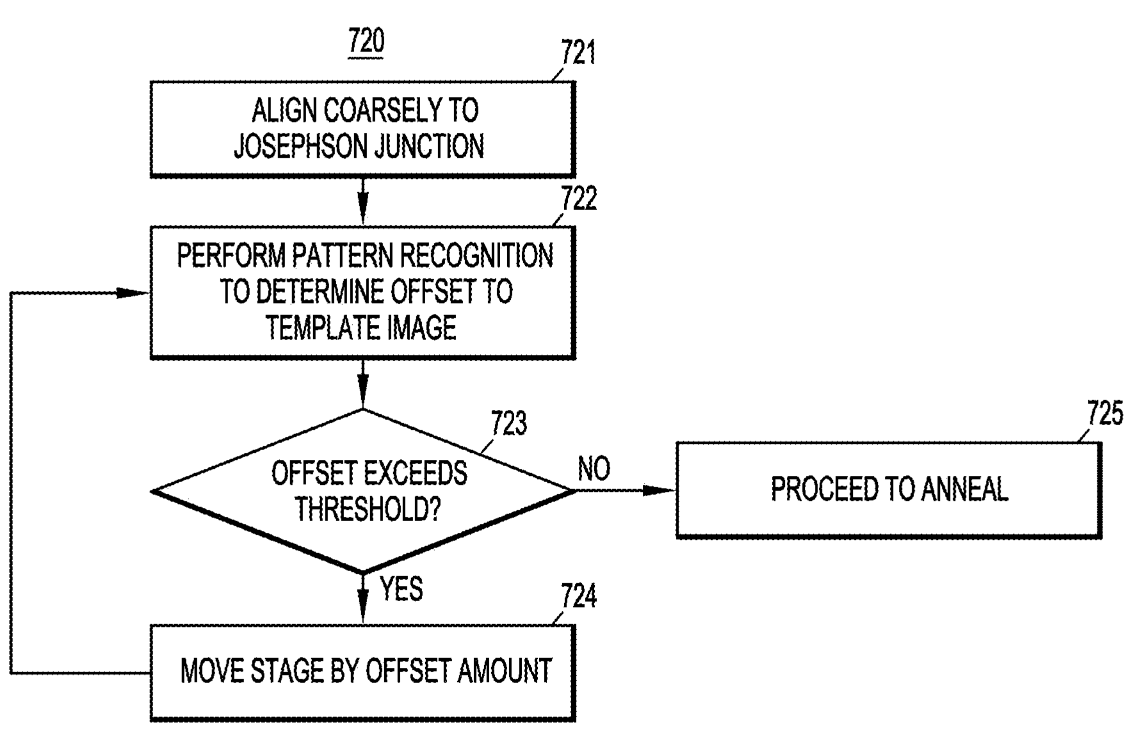
FIG. 7C illustrates a flow diagram of a method for focusing and aligning to a target Josephson junction for the purpose of performing a laser anneal process, according to an exemplary embodiment of the disclosure.

FIG. 7C illustrates a flow diagram of a method for focusing and aligning to a target Josephson junction for the purpose of performing a laser anneal process, according to an exemplary embodiment of the disclosure. In some embodiments, FIG. 7C illustrates an exemplary process 720 for implementing the focus/alignment processes in block 606 of FIG. 6. An initial step of the process 720 involves performing a coarse alignment process (block 721) in which the X-Y-Z stage 142 is controllably operated to, e.g., move back to the Z position that was previously determined to place the image plane at or near the focal plane as a result of the focusing step (e.g., block 704, FIG. 7A) performed for the in-situ junction resistance measurement. In this instance, it is assumed that the target Josephson junction is placed back to a position that is aligned (or nearly aligned) to the center of the FOV of the microscope unit (block 701). A pattern recognition operation is performed to determine an amount of offset (if any) between the sample image taken of the Josephson junction in the FOV and a template image of the Josephson junction aligned to the center of the FOV (block 722). In some embodiments, the pattern recognition operation may be performed using a cross-correlation between the sample image and the template image to quantify the quality of the match, and the corresponding amount of offset (if any) required to optimize the match.

Next, a determination is then made as to whether the offset as determined exceeds an offset threshold (block 723). For example, such a determination can be made to determine whether the sample image of the Josephson junction in the FOV is misaligned in the X direction, the Y direction, or in both the X and Y directions, by some offset amount which exceeds an offset threshold. If the X offset and/or Y offset is determined to exceed the offset threshold (affirmative determination in block 723), the X-Y-Z stage 142 is controllably moved in the X and/or Y direction by the determined offset amount to correct for the misalignment in the X direction and/or Y direction (block 724), and the pattern recognition and offset determination steps (blocks 722 and 723) are repeated. Once the sample image of the Josephson junction in the FOV is determined to be aligned to the template image, the tuning process proceeds to the laser anneal operation (block 725).

Figure 7D:
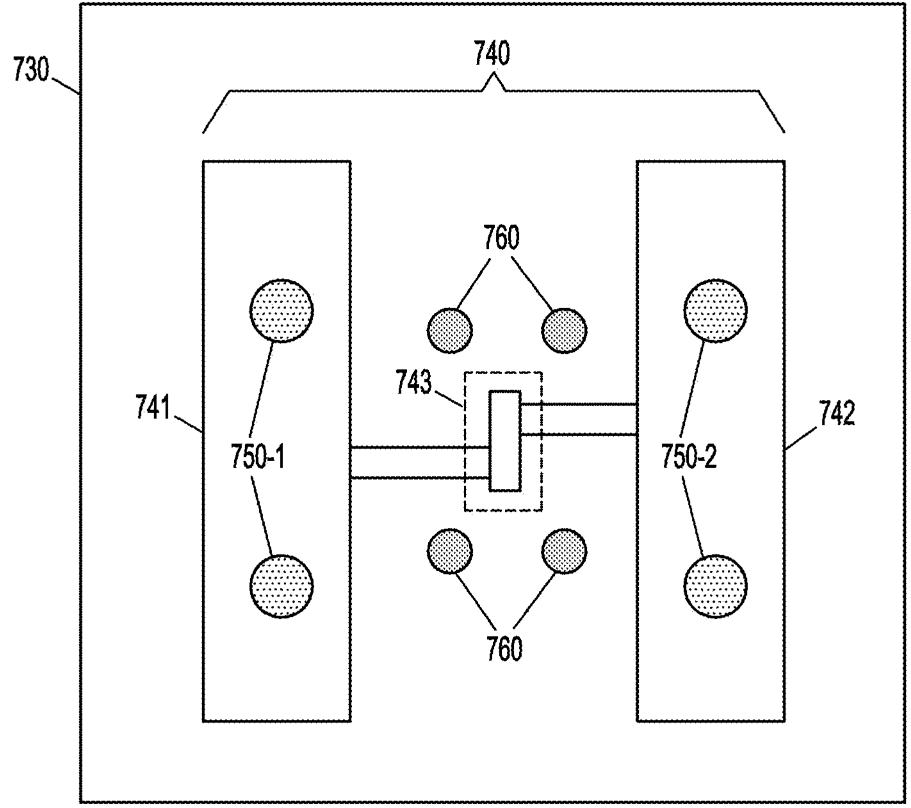
FIG. 7D schematically illustrates a process for aligning contact probes and laser spots to a Josephson junction of a quantum bit, according to an exemplary embodiment of the disclosure.

FIG. 7D schematically illustrates a process for aligning contact probes and laser spots to a Josephson junction of quantum bit, according to an exemplary embodiment of the disclosure. In particular, FIG. 7D schematically illustrates an exemplary FOV 730 which schematically illustrates a superconducting qubit 740. The superconducting qubit 740 comprises a transmon qubit comprising a capacitor and Josephson junction connected in parallel. In particular, the superconducting qubit 740 comprises a first superconducting pad 741, a second superconducting pad 742, and a Josephson junction 743 coupled to, and disposed between, the first and second superconducting pads 741 and 742. The first and second superconducting pads 741 and 742 comprise electrodes of a coplanar parallel-plate capacitor structure of the superconducting qubit 740. The Josephson junction 743 functions as a non-linear inductor which, when shunted with the capacitor formed by the first and second superconducting pads 741 and 742 forms an anharmonic LC oscillator with individually addressable energy levels (e.g., two lowest energy level corresponding to the ground state $|0\rangle$ and the first excited state $|1\rangle$ ) with a given transition frequency $f_{01}$. As noted above, laser annealing is applied to the Josephson junction 743 to monotonically increase the junction resistance the Josephson junction 743 to a target junction resistance, which results in an incremental decrease in transition frequency $f_{01}$ of the superconducting qubit 740 to a target transition frequency.

The FOV 730 represents the area of the object that is imaged by the microscope unit 130, wherein the size of the FOV is generally determined by the magnification of the objective lens 137. In the exemplary camera-objective architecture of the microscope unit 130, the FOV of the objective lens is applied to an image sensor (e.g., focal plane array) of the camera 132. Since the image sensor is rectangular in shape, the images captured by the microscope unit 130 have a rectangular FOV, as shown in FIG. 7D, which does not capture the full circular FOV from the objective lens 137.

FIG. 7D schematically illustrates an exemplary alignment process in which a plurality of electrical probes 750-1 and 750-2 (e.g., probe tips) are aligned in contact with the first and second superconducting pads 741 and 742 which comprise the electrodes of a coplanar parallel-plate capacitor of the superconducting qubit 740. In particular, FIG. 7D illustrates an electrical probe configuration to implement a 4-wire (Kelvin) resistance measurement, wherein the electrical probes 750-1 comprise two probes that make contact to the first superconducting pad 741, and wherein the electrical probes 750-2 comprise two probes that make contact to the second superconducting pad 742. In this embodiment, the first and second superconducting pads 741 and 742 serve as the contact pads of the Josephson junction 743 on which the electrical probes are landed to perform an in-situ junction resistance measurement.

In some embodiments, a template image that is used to perform a pattern recognition alignment process comprises an image of the entirety of the superconducting qubit 740 including first and second superconducting pads 741 and 742, and the Josephson junction 743. In other embodiments, a template image that is used to perform a pattern recognition alignment process comprises an image of the Josephson junction 743. In other embodiments, one or more additional features of the template image can be used to perform a pattern recognition alignment process.

FIG. 7D further illustrates an exemplary pattern of laser spots 760 which can be used to laser anneal the Josephson junction 743. In particular, the exemplary pattern of laser spots 760 comprises 4 spots which correspond to, e.g., four laser beams generated by the laser beam shaper 135 (FIG. 1) implemented using a 2-by-2 diffractive beam splitter generate 4 laser beams that are projected onto the surface of the quantum chip 160 via the microscope unit 130. As schematically illustrated in FIG. 7D, the Josephson junction 743 is aligned in the FOV 730 such that the laser beam spot pattern comprises two laser spots positioned on one side (e.g., above) of the Josephson junction 743, and two laser spots position on an opposite side (e.g., below) the Josephson junction 743, wherein the laser spots 760 are positioned to illuminate (and heat) regions of the upper surface of the quantum chip 160 in proximity to the Josephson junction 743, but not directly illuminate the Josephson junction 743. In other embodiments, other types of laser spot patterns can be utilized to laser anneal the Josephson junction 743. For example, the different laser spot patterns include, e.g., a 1-spot pattern, a 2-spot pattern, a 6-spot pattern, etc., depending on the application and/or the geometry of the features that are being laser annealed.

It is to be noted that while FIG. 7D illustrates a superconducting qubit 740 comprising a single Josephson junction 743, other types of superconducting qubits or quantum devices can have multiple Josephson junctions, which can be laser annealed concurrently using a suitable laser spot pattern. For example, some quantum devices, such as tunable qubit couplers, comprise a SQUID, wherein the SQUID comprises a pair of Josephson junctions which are connected in parallel to form a superconducting loop (referred to as SQUID loop) through which an external magnetic flux $\phi$ can be threaded to control operation of the tunable qubit coupler. In this regard, the Josephson junctions of a SQUID can be laser annealed and tuned concurrently by using a suitable laser spot pattern that is configured to heat the substrate regions surrounding the two Josephson junctions of the SQUID. It is to be further noted that while fixed-frequency qubits such as shown in FIG. 7D are candidates for laser tuning using the exemplary laser tuning techniques as disclosed herein, it is to be understood that such exemplary techniques may be implemented to laser tune any quantum element comprising at least one Josephson junction, including, but not limited to fixed-frequency transmon qubits, SQUID devices, and the like.

FIG. 8A is a flow diagram of a method of utilizing a laser annealing apparatus to perform annealing operations in conjunction with in-situ DC resistance measurements to tune junction resistances of Josephson junctions, according to an exemplary embodiment of the disclosure. In particular, FIG. 8A illustrates an exemplary process 800 for tuning the junction resistances of Josephson junctions using a bulk thermal annealing phase, which can be performed using, e.g., the thermoelectric cooler 443 (e.g., temperature-controlled wafer chuck system) of the exemplary electrical characterization system 440 (FIG. 4), followed by a targeted laser annealing phase. In some embodiments, the bulk thermal annealing phase comprises an initial step of performing in-situ resistance measurements at room temperature to measure the junction resistances of a Josephson junctions of superconducting qubits in a given qubit lattice on a given quantum device, e.g., quantum chip/wafer (block 801).

The quantum device is then heated to a target temperature for a specified time (block 802) to perform a bulk thermal annealing process which is designed to shift (increase) the junction resistances of the Josephson junctions by a desired amount. The quantum device is then cooled back down to room temperature (block 803) and in-situ resistance measurements are performed to remeasure the junction resistances of the Josephson junctions at room temperature. In an exemplary embodiment, the resistance measurement operations (blocks 801 and 804) comprise DC measurements that are performed using, e.g., 4-wire (Kelvin) resistance measurement operations.

Following the bulk thermal annealing phase, the process 800 proceeds to perform a targeted laser annealing phase to laser tune the junction resistances of the Josephson junctions to respective target junction resistances. In particular, the process 800 generates a tuning plan (block 805) for tuning the transition frequencies of the superconducting qubits to target transition frequencies, wherein the tuning plan is generated based on the currently measured junction resistances, and determines respective target junction resistances for the Josephson junctions under certain constraints such as current junction resistances, the maximum tuning ranges that are achievable to shift the current junction resistances of the Josephson junctions to target junction resistances, etc. The process 800 then proceeds to perform laser annealing operations to laser tune the Josephson junctions based on the generated tuning plan (block 806). For example, the laser tuning/annealing operations of block 806 can be implemented using, e.g., the processes of FIGS. 5 and 6.

Figure 8B:
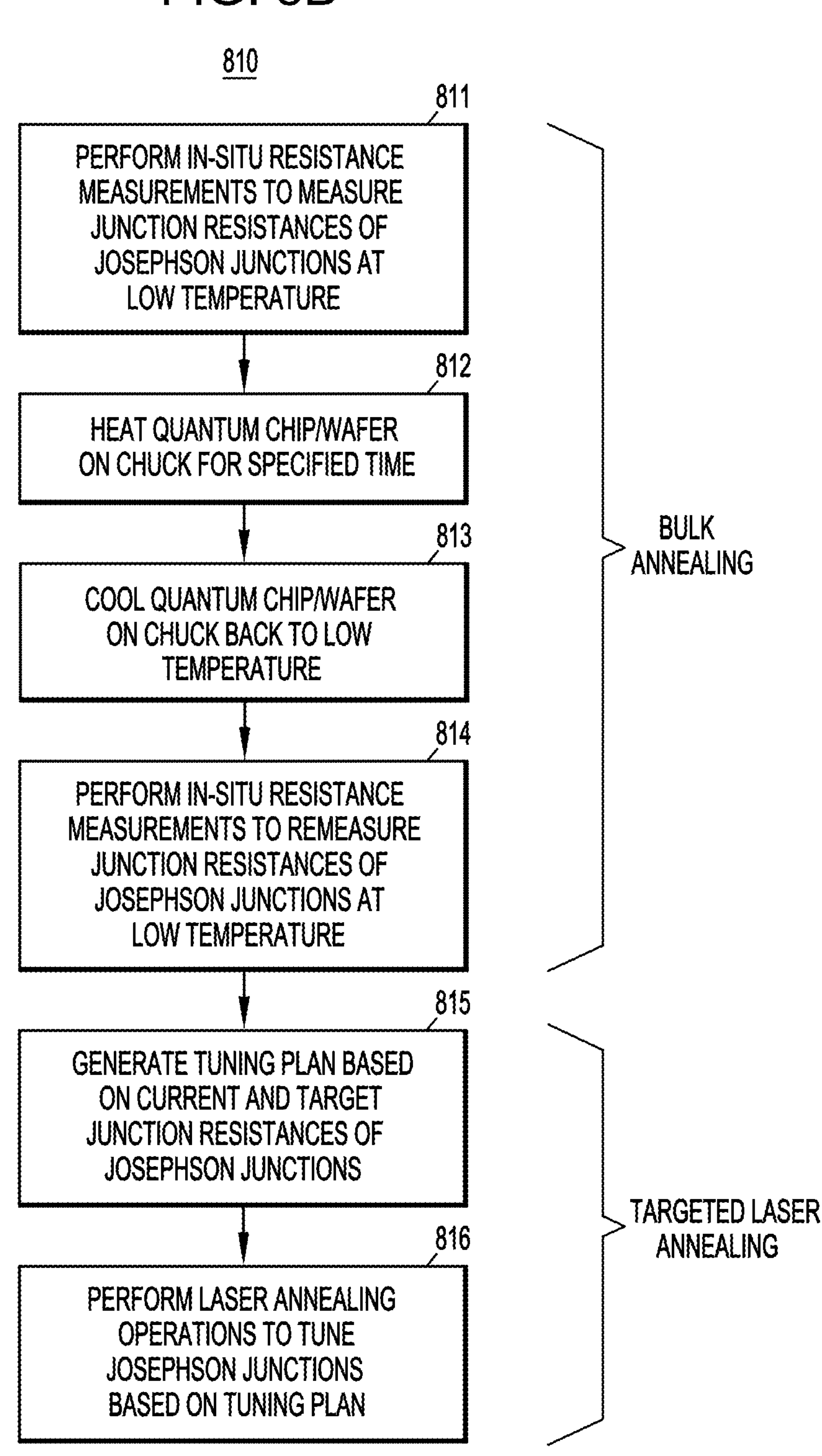
FIG. 8B is a flow diagram of a method of utilizing a laser annealing apparatus to perform annealing operations in conjunction with in-situ DC resistance measurements to tune junction resistances of Josephson junctions, according to another exemplary embodiment of the disclosure.

FIG. 8B is a flow diagram of a method of utilizing a laser annealing apparatus to perform annealing operations in conjunction with in-situ DC resistance measurements to tune junction resistances of Josephson junctions, according to another exemplary embodiment of the disclosure. In particular, FIG. 8B illustrates an exemplary process 810 for tuning the junction resistances of Josephson junctions using a bulk thermal annealing phase, which can be performed using, e.g., the thermoelectric cooler 443 (e.g., temperature-controlled wafer chuck system) of the exemplary electrical characterization system 440 (FIG. 4), followed by a targeted laser annealing phase. In some embodiments, the bulk thermal annealing phase comprises an initial step of performing in-situ resistance measurements at a specified low temperature to measure the junction resistances of a Josephson junctions of superconducting qubits in a given qubit lattice on a given quantum device, e.g., quantum chip/wafer (block 811) with the quantum device cooled down to the low temperature. The low temperature resistance measurements provide more precise resistance measurements (e.g., low noise electrical measurements), as well as reducing the contribution of substrate conductivity on the junction resistance measurement.

The quantum device is then heated to a target temperature for a specified time (block 812) to perform a bulk thermal annealing process which is designed to shift (increase) the junction resistances of the Josephson junctions by a desired amount. The quantum device is then cooled back down to the target low temperature (block 813) and in-situ resistance measurements are performed to remeasure the junction resistances of the Josephson junctions with the quantum device cooled at the low temperature. In an exemplary embodiment, the resistance measurement operations (blocks 811 and 814) comprise DC measurements that are performed using, e.g., 4-wire (Kelvin) resistance measurement operations.

Following the bulk thermal annealing phase, the process 810 proceeds to perform a targeted laser annealing phase to laser tune the junction resistances of the Josephson junctions to respective target junction resistances. In particular, the process 810 generates a tuning plan (block 815) for tuning the transition frequencies of the superconducting qubits to target transition frequencies, wherein the tuning plan is generated based on the currently measured junction resistances, and determines respective target junction resistances for the Josephson junctions under certain constraints such as the current junction resistances, the maximum tuning ranges that are achievable to shift the current junction resistances of the Josephson junctions target junction resistances, etc. The process 810 then proceed to perform laser annealing operations to tune the Josephson junctions based on the generated tuning plan (block 816). For example, the laser tuning/annealing operations of block 806 can be implemented using the processes of FIGS. 5 and 6.

FIG. 9 is a flow diagram of a method of utilizing a laser annealing apparatus to perform annealing operations in conjunction with in-situ AC resistance measurements to tune junction resistances of Josephson junctions, according to an exemplary embodiment of the disclosure. In particular, FIG. 9 illustrates an exemplary process 900 for tuning the junction resistances of Josephson junctions using a bulk thermal annealing phase, which can be performed using, e.g., the thermoelectric cooler 443 (e.g., temperature-controlled wafer chuck system) of the exemplary electrical characterization system 440 (FIG. 4), followed by a targeted laser annealing phase. In some embodiments, the bulk thermal annealing phase comprises an initial step of performing in-situ AC resistance measurements at a specified low temperature to measure the junction resistances of a Josephson junctions of superconducting qubits in a given qubit lattice on a given quantum device, e.g., quantum chip/wafer (block 911) with the quantum device cooled down to the low temperature. The low temperature resistance measurements provide more precise resistance measurements. In addition, in some embodiments, the AC measurements are performed at a frequency of about 1.0 kHz or greater. The high-frequency resistance measurements are configured to mitigate 1/f noise, and thereby increase the precision of the junction resistance measurements.

The quantum device is then heated to a target temperature for a specified time (block 912) to perform a bulk thermal annealing process which is designed to shift (increase) the junction resistances of the Josephson junctions by a desired amount. The quantum device is then cooled back down to the target low temperature (block 913) and in-situ resistance measurements are performed using AC measurements to remeasure the junction resistances of the Josephson junctions with the quantum device cooled at the low temperature. In an exemplary embodiment, the resistance measurement operations (blocks 911 and 914) comprise AC measurements that are performed using, e.g., 4-wire (Kelvin) resistance measurement operations at the low temperature.

Following the bulk thermal annealing phase, the process 900 proceeds to perform a targeted laser annealing phase to laser tune the junction resistances of the Josephson junctions to respective target junction resistances. In particular, the process 900 generates a tuning plan (block 915) for tuning the transition frequencies of the superconducting qubits to target transition frequencies, wherein the tuning plan is generated based on the currently measured junction resistances, and determines respective target junction resistances for the Josephson junctions under certain constraints such as the current junction resistances, the maximum tuning ranges that are achievable to shift the current junction resistances of the Josephson junctions to their target junction resistances, etc. The process 900 then proceeds to perform laser annealing operations to tune the Josephson junctions based on the generated tuning plan (block 916). For example, the laser tuning/annealing operations of block 916 can be implemented using the processes of FIGS. 5 and 6.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 10:
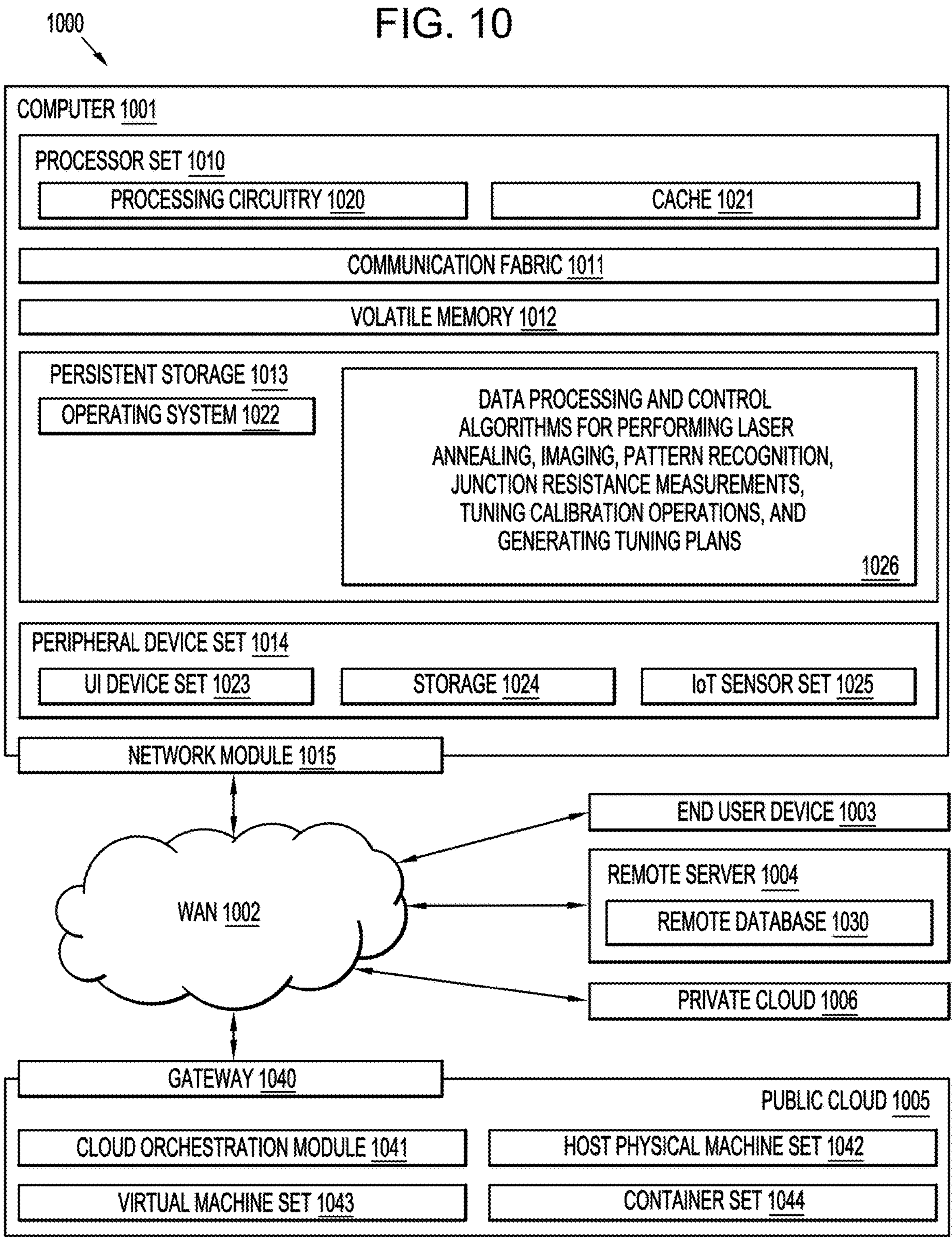
FIG. 10 schematically illustrates an exemplary architecture of a computing environment for implementing a control system that is configured to control a laser annealing system for tuning Josephson junctions, according to an exemplary embodiment of the disclosure.

Computing environment 1000 of FIG. 10 contains an example of an environment for the execution of at least some of the computer code (block 1026) comprising data processing and control algorithms for performing various operations such as laser annealing operations, imaging operations, machine learning pattern recognition operations, junction resistance measurement operations, tunning calibration operations, and other computer automated control and data processing operations as discussed herein for performing the various methods as shown and described, for example, in conjunction with FIGS. 1, 2A, 2B, 2C, 3A, 3B, 4, 5, 6, 7A, 7B, 7C, 7D, 8A, 8B, and 9. In addition to block 1026, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 1026, as identified above), peripheral device set 1014 (including user interface (UI), device set 1023, storage 1024, and Internet of Things (IoT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

Computer 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 10. On the other hand, computer 1001 is not required to be in a cloud except to any extent as may be affirmatively indicated.

Processor set 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1021 and the other storage media discussed below. The program instructions, and associated data, are accessed by processor set 1010 to control and direct performance of the inventive methods. In computing environment 1000, at least some of the instructions for performing the inventive methods may be stored in block 1026 in persistent storage 1013.

Communication fabric 1011 comprises the signal conduction paths that allow the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1012 is any type of volatile memory now known or to be developed in the future. Examples include dynamic type random access memory (RAM) or static type RAM. Typically, the volatile memory is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

Persistent storage 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid-state storage devices. Operating system 1022 may take several forms, such as various known proprietary operating systems or open source Portable Operating System Interface type operating systems that employ a kernel. The code included in block 1026 typically includes at least some of the computer code involved in performing the inventive methods.

Peripheral device set 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

Network module 1015 is the collection of computer software, hardware, and firmware that allows computer 1001 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the exemplary inventive methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1003 is any computer system that is used and controlled by an end user (for example, a customer of an enterprise that operates computer 1001), and may take any of the forms discussed above in connection with computer 1001. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

Remote server 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

Public cloud 1005 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An optical apparatus, comprising:

a collimator configured to receive an optical beam through an optical fiber coupled to an optical source and to generate a collimated optical beam;

an optical beam shaper configured to receive the collimated optical beam and to split the collimated optical beam into a plurality of optical beams in accordance with an optical beam pattern configured to laser anneal a target device;

a first set of optical components configured to receive the plurality of optical beams and to manipulate the plurality of optical beams with respect to the target device; and an imager configured to generate an image of the target device in a field of view of the optical apparatus.

2. The optical apparatus of claim 1, wherein the optical fiber comprises a single-mode polarization-maintaining optical fiber.

3. The optical apparatus of claim 1, further comprising a beam shutter operatively coupled between the collimator and the optical beam shaper and configured to affect an exposure time for laser annealing the target device.

4. The optical apparatus of claim 1, wherein the optical beam shaper comprises a diffractive optical element configured to selectively determine the optical beam pattern for laser annealing the target device.

5. The optical apparatus of claim 4, wherein the optical beam pattern is selectively determined from a set of different spot geometries.

6. The optical apparatus of claim 1, further comprising:

a light source configured to generate light; and a second set of optical components configured to manipulate the light generated by the light source to illuminate the target device in the field of view of the optical apparatus and prevent the light source from being visible in the image of the target device.

7. The optical apparatus of claim 6, wherein the light source comprises a light-emitting diode.

8. The optical apparatus of claim 6, wherein the second set of optical components comprises:

a lens configured to manipulate the light generated by the light source to generate an illumination beam along a first optical path;

a mirror configured to redirect the illumination beam along a second optical path; and a beam splitter disposed in the second optical path and configured to split the illumination beam to propagate the illumination beam in a third optical path between the imager and the field of view of optical apparatus.

9. The optical apparatus of claim 1, wherein the first set of optical components comprises one or more lens and one or more mirrors operatively coupled to manipulate the plurality of optical beams.

10. The optical apparatus of claim 1, further comprising a power monitor configured to monitor a power level of the collimated optical beam.

11. The optical apparatus of claim 1, wherein at least the collimator, the optical beam shaper, the first set of optical components, and the imager are arranged in a modular configuration to portably integrate with an electrical characterization system configured to measure one or more electrical characteristics of the target device in conjunction with the laser annealing caused by the optical source.

12. A system, comprising:

a control system; and an optical apparatus comprising:

a collimator configured to receive an optical beam through an optical fiber coupled to an optical source and to generate a collimated optical beam;

an optical beam shaper configured to receive the collimated optical beam and to split the collimated optical beam into a plurality of optical beams in accordance with an optical beam pattern configured to laser anneal a target device;

a set of optical components configured to receive the plurality of optical beams and to manipulate the plurality of optical beams with respect to the target device; and an imager configured to generate an image of the target device in a field of view of the optical apparatus;

wherein the control system controls at least a portion of the optical apparatus to enable laser annealing of the target device.

13. The system of claim 12, wherein the optical apparatus further comprises a beam shutter operatively coupled between the collimator and the optical beam shaper and configured to affect an exposure time for laser annealing the target device.

14. The system of claim 12, wherein the optical beam shaper of the optical apparatus further comprises a diffractive optical element configured to selectively determine the optical beam pattern for laser annealing the target device.

15. The system of claim 12, wherein the control system is configured to process the image of the target device generated by the imager and cause alignment of the target device in the field of view of the optical apparatus to the optical beam pattern for laser annealing the target device.

16. The system of claim 12, wherein the target device comprises a Josephson junction of a superconducting quantum bit.

17. The system of claim 12, wherein at least the collimator, the optical beam shaper, the set of optical components, and the imager of the optical apparatus are arranged in a modular configuration to portably integrate with an electrical characterization system configured to measure one or more electrical characteristics of the target device in conjunction with the laser annealing caused by the optical source.

18. An optical microscope device comprising an optically integrated configuration of components for imaging a target device within a field of view of the optical microscope device, and for laser annealing the target device by generating a laser beam spot pattern from a laser beam received on an optical fiber from a remote laser source, and for controlling a duration of exposure of the laser beam spot pattern for laser annealing the target device.

19. The optical microscope device of claim 18, wherein the optical microscope device comprises a modular device which is configured for mounting to an electrical characterization system to enable in-situ electrical characterization of the target device in conjunction with laser annealing.

20. The optical microscope device of claim 19, wherein the electrical characterization system comprises a wafer-scale prober unit.

* * * * *